United States Patent
Jones, III et al.

(10) Patent No.: US 10,630,307 B1
(45) Date of Patent: Apr. 21, 2020

(54) OPTIMIZED ARRAYS FOR SEGMENTED SUCCESSIVE-APPROXIMATION-REGISTER (SAR) ANALOG-TO-DIGITAL CONVERTER (ADC)

(71) Applicant: NXP USA, Inc., Austin, TX (US)

(72) Inventors: Robert S. Jones, III, Austin, TX (US); Tao Chen, Austin, TX (US); Colin McAndrew, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/578,201

(22) Filed: Sep. 20, 2019

Related U.S. Application Data

(63) Continuation-in-part of application No. 16/181,349, filed on Nov. 6, 2018, now abandoned.

(51) Int. Cl.
| | |
|---|---|
| *H03M 1/34* | (2006.01) |
| *H03M 1/38* | (2006.01) |
| *H03M 1/06* | (2006.01) |
| *H03M 1/10* | (2006.01) |

(52) U.S. Cl.
CPC ........... *H03M 1/38* (2013.01); *H03M 1/0617* (2013.01); *H03M 1/1009* (2013.01)

(58) Field of Classification Search
CPC .... H03M 1/38; H03M 1/1009; H03M 1/0617; H03M 1/462; H03M 1/403; H03M 1/12; H03M 1/00; H03M 1/802; H03M 1/804; H03M 1/806
USPC ........................................ 341/163, 161, 155
See application file for complete search history.

(56) References Cited

U.S. PATENT DOCUMENTS

| | | | |
|---|---|---|---|
| 5,404,143 A * | 4/1995 | Distinti ................. | G06N 3/063 341/158 |
| 6,880,134 B2 | 4/2005 | Drennan | |
| 7,876,254 B2 * | 1/2011 | Berens ............... | H03M 1/0682 341/144 |

(Continued)

OTHER PUBLICATIONS

Lin et al., "Common-Centroid Capacitor Placement Considering Systematic arid Random Mismatches in Analog Integrated Circuits," DAC '11; Jun. 5-10, 2011; ACM 978-1-4503-0636-2/11/06; pp. 528-533.

(Continued)

*Primary Examiner* — Jean B Jeanglaude

(57) ABSTRACT

An integrated circuit including a segmented successive approximation register (SAR) analog-to-digital converter (ADC) includes a first capacitive structure with a first plurality of capacitive structure subcomponents that each include a first terminal selectively connected to one of a plurality of input voltage nodes and a second terminal connected to a common conductor, and second capacitive structure with a second plurality of capacitive structure subcomponents that each include a first terminal selectively connected to one of the plurality of input voltage nodes and a second terminal connected to the common conductor. The first and second plurality of capacitive structure subcomponents are arranged in an array in which none of the first plurality of capacitive structure subcomponents are directly adjacent to one another and none of the second plurality of capacitive structure subcomponents are directly adjacent to one another in a first row in the array.

20 Claims, 7 Drawing Sheets

(56) References Cited

U.S. PATENT DOCUMENTS

| | | | |
|---|---|---|---|
| 8,228,076 B2* | 7/2012 | Cormier, Jr. | G06F 3/044 |
| | | | 324/678 |
| 9,312,877 B2* | 4/2016 | Strode | H03M 1/38 |
| 9,322,863 B2* | 4/2016 | Cormier, Jr. | G06F 3/044 |
| 2010/0079319 A1* | 4/2010 | Berens | H03M 1/1038 |
| | | | 341/120 |
| 2010/0079327 A1* | 4/2010 | Berens | H03M 1/0682 |
| | | | 341/158 |
| 2015/0263754 A1* | 9/2015 | Srinivas | H01G 4/228 |
| | | | 341/161 |

OTHER PUBLICATIONS

Son et al., "High-Resolution 12-Bit Segmented Capacitor DAC in Successive Approximation ADC," World Academy of Science, Engineering and Technology; International Journal of Electronics and Communication Engineering, vol. 6, No. 12; Jan. 2012; pp. 1383-1386.

Zheng et ai., "Novel Two-Spilt Capacitor Array with Linearity Analysis for High-Resolution SAR ADCs," International Journal of Electronics and Electrical Engineering, vol. 3, No. 3; Jun. 2015; pp, 177-181.

* cited by examiner

A = MSB CAPACITOR = C14
B = MSB-1 CAPACITOR = C13
C = MSB-2 CAPACITOR = C12
D = MSB-3 CAPACITOR = C11
E = CALIBRATION CAPACITOR

FIG. 2

OPTIMIZED ARRAYS FOR SEGMENTED SUCCESSIVE-APPROXIMATION-REGISTER (SAR) ANALOG-TO-DIGITAL CONVERTER (ADC)

FIELD OF THE DISCLOSURE

The present disclosure relates generally to analog-to-digital converter (ADC) integrated circuits (ICs) and more particularly to segmented successive approximation register (SAR) ADC ICs.

BACKGROUND OF THE DISCLOSURE

Information can be represented by electrical signals in various ways. As an example, an electrical parameter, such as voltage or current, of a signal can vary in amplitude in accordance with the information. Such a signal is typically referred to as an analog signal. As another example, an electrical parameter of a signal can be set to discrete levels, over one or more spans of time, to represent the information. Such a signal is typically referred to as a digital signal. It is useful to be able to convert information between the analog form of an analog signal and the digital form of a digital signal. Such conversion can be performed by a circuit, typically in the form of an IC, referred to as an ADC. Among the types of ADCs in existence are successive approximation register (SAR) ADCs. SAR ADCs can perform a sequence of operations directed to subsets of the total number of bits to be obtained by the conversion. As an example, SAR ADCs can begin with the most significant bit (MSB) of the digital value of the digital signal and continue obtaining bits of lesser significance until the conversion has been completed.

An amount of circuitry and an amount of processing time for performing the conversion can be saved by using a segmented SAR ADC. A segmented SAR ADC can obtain a digital value as a conversion result by obtaining the bit values of bits of the digital value in groups. A segmented SAR ADC can have a plurality of separate capacitor arrays grouped into different segments. The separate capacitor arrays can be connected together with series capacitors. A segment can provide a plurality of bits fewer than the total number of bits. The bit values of the pluralities of bits can be concatenated to form the digital value as a whole. Segmented successive approximation registers (SARs) can be of benefit by enabling a small size and a high speed of an ADC. However, the performance of a segmented SAR ADC can be impaired if the values of components do not match their ideal values, either in absolute value or in their respective values relative to one another. For example, it can be difficult to achieve optimal matching in the most-significant-bit (MSB) array segment of a multi-segment version, such as a three-segment version. Levels of mismatching occurring in modern semiconductor technologies can exceed the ability of traditional techniques to provide a solution. Thus, a new technique is needed to provide desired ADC performance using modern semiconductor technologies.

BRIEF DESCRIPTION OF THE DRAWINGS

The present disclosure may be better understood, and its numerous features and advantages made apparent to those skilled in the art by referencing the accompanying drawings.

FIG. 2 is a plan view diagram illustrating a plurality of patterns of capacitive structure subcomponents of an array of capacitive structures as situated on a semiconductor die in accordance with at least one embodiment.

The use of the same reference symbols in different drawings indicates similar or identical items.

DETAILED DESCRIPTION OF THE DRAWINGS

Figure 1:
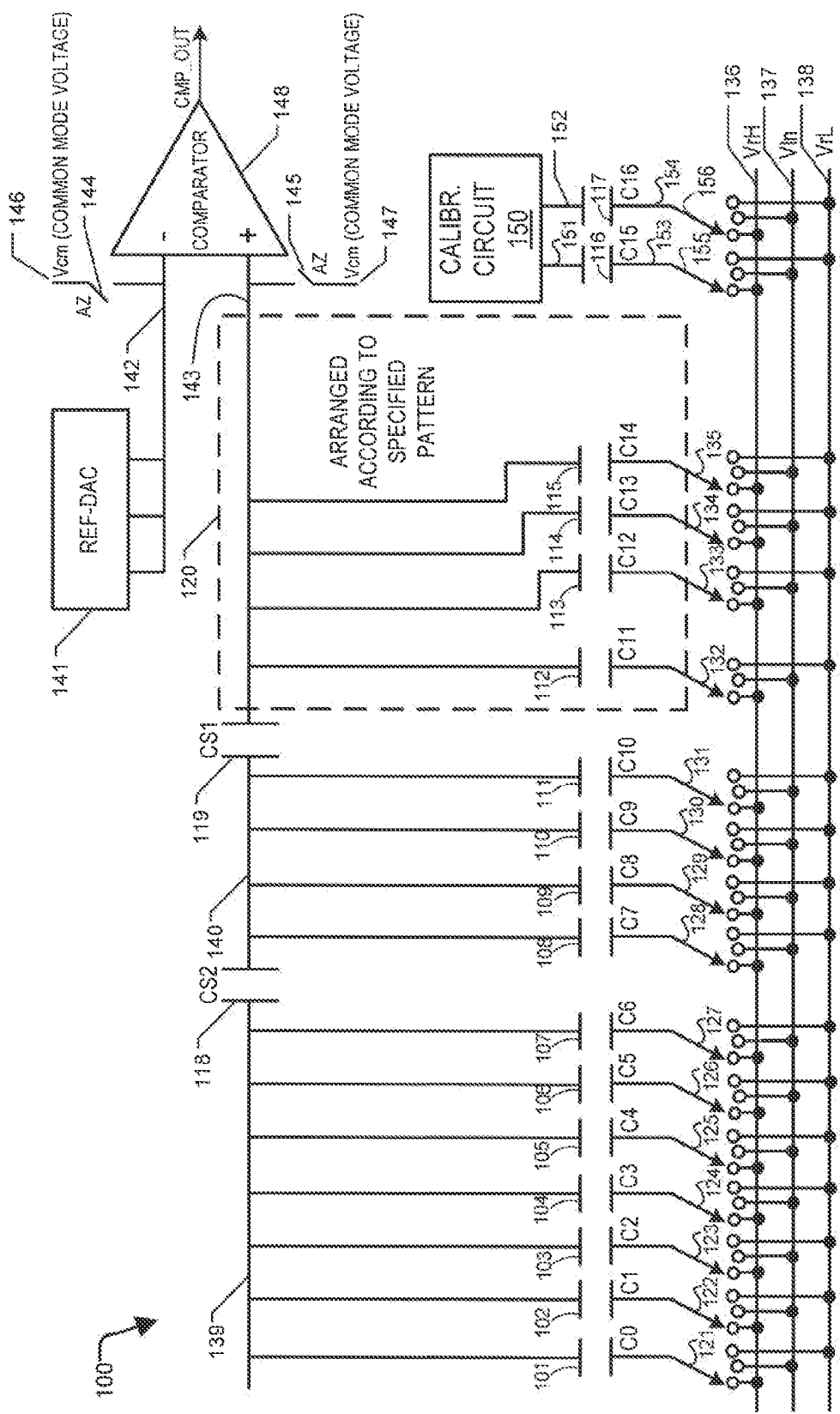
FIG. 1 is a schematic diagram illustrating a circuit comprising an array of capacitive structures in accordance with at least one embodiment.

Data conversion between an analog domain and a digital domain is useful for digitally processing information of an often analog environment. A segmented successive approximation register (SAR) analog-to-digital converter (ADC) comprises a multiplying digital-to-analog converter (MDAC). A MDAC utilizes a plurality of capacitors to perform its data conversion. An array of capacitive structures for improving component matching for a segmented SAR ADC is provided, wherein the array of capacitive structures is configured to compensate for characteristic variations within material from which an integrated circuit (IC) is fabricated. Several arrays of capacitive structures having subcomponents arranged in particular patterns have been created. Such particular patterns fulfill a long-standing need for a higher degree of component matching, providing superior results. The lack of an intuitive sense of why these particular patterns are superior to patterns large numbers of seemingly similar patterns underscores the great challenges of creating the particular patterns set forth herein and the remarkably unexpected superior results these particular patterns provide. Several such patterns are shown below, with a first plurality of capacitive structure subcomponents are denoted by the letter A, a second plurality of capacitive structure subcomponents are denoted by the letter B, a third plurality of capacitive structure subcomponents are denoted by the letter C, a fourth plurality of capacitive structure subcomponents are denoted by the letter D, and a fifth plurality of capacitive structure subcomponents are denoted by the letter E in a topological layout on a semiconductor die selected from a group consisting of:

a first pattern as follows:
ABCABAADAEBACAABACBAEAABABDABAAC,
DAABACBABAACABEABAAEABCACAABADBA;
a second pattern as follows:
ADACABBBABACADAEACABABAABABACAE,
EACABABAABABACAEADACABABBABACADA;
a third pattern as follows:
ACADABACABABAEABACADABACABABAEAB, BAEABABACABADACABAEABABACABADACA;
a fourth pattern as follows:
ACADAABABACAEBABACADAABABACAEBAB,
BABEACABABAADACABABEACABABAADACA;
and
a fifth pattern as follows:
ABABABAEABACACADABABABAEABACACAD,
DACACABAEABABABADACACABAEABABABA.

The first pattern shown above has a dispersion value of 0.8298 and a maximum difference in second order gradient effect (maxD2) value of 528. The second pattern shown above has a dispersion value of 0.9149 and a maxD2 value of 204. The third pattern shown above has a dispersion value of 1 and a maxD2 value of 44. The fourth pattern shown above has a dispersion value of 0.8298 and a maxD2 value of 18. The fifth pattern shown above has a dispersion value of 1 and a maxD2 value of 224. All five of the above patterns cancel first order process gradients.

The patterns shown above unexpectedly achieve extraordinary levels of performance, providing technological improvement over existing technology, even compared to other novel patterns that also distribute the first through fifth pluralities of capacitive structure subcomponents over two rows. For example, another novel pattern of the same five pluralities of capacitive structure subcomponents is as follows:
ACBEBAACAAABDBAAACBEBAACAAABDBAA
AABDBAAACAABEBCAAABDBAAACAABEBCA However, such a pattern has a remarkably low dispersion of 0.1915, much lower than any of the other patterns shown further above. The dispersion measures how "clumped together" the same letters are, and the AA and AAA groupings contribute to the lower dispersion value. Thus, even though the above pattern exhibits a remarkably high maximum difference in $2^{nd}$ order gradient effect (maxD2) of 18, its lower dispersion gives it overall lower performance than the other patterns shown further above.

As another example, another novel pattern of the same five pluralities of capacitive structure subcomponents is as follows:
ECBABCBADAAABAAAECBABCBADAAABAAA
AAABAAADABCBABCEAAABAAADABCBABCE Such a pattern has a remarkably poor maxD2 of 224, and its dispersion of 0.6956 is better than that of the example shown immediately above, but much worse than the dispersions values of any of the other patterns shown further above. Thus, this pattern also has overall performance lower than the other patterns shown further above.

FIG. 1 is a schematic diagram illustrating an integrated circuit comprising an array of capacitive structures in accordance with at least one embodiment. Circuit 100 comprises capacitive structures 101, 102, 103, 104, 105, 106, 107, 108, 109, 110, 111, 112, 113, 114, 115, 116, 117, 118, and 119, switches 121, 122, 123, 124, 125, 126, 127, 128, 129, 130, 131, 132, 133, 134, 135, 155, and 156, reference (REF) digital-to-analog converter (DAC) 141, comparator 148, switches 144 and 145, and calibration circuit 150. A conductive common conductor 139 is connected to a first terminal of each of capacitors 101, 102, 103, 104, 105, 106, 107, and 118. A second terminal of capacitor 101 is connected to a common terminal of switch 121. Switch 121 can connect its common terminal to any one of high reference voltage (VrH) node 136, input voltage (VIn) node 137, and low reference voltage (VrL) node 138. A second terminal of capacitor 102 is connected to a common terminal of switch 122. Switch 122 can connect its common terminal to any one of high reference voltage (VrH) node 136, input voltage (VIn) node 137, and low reference voltage (VrL) node 138. A second terminal of capacitor 103 is connected to a common terminal of switch 123. Switch 123 can connect its common terminal to any one of high reference voltage (VrH) node 136, input voltage (VIn) node 137, and low reference voltage (VrL) node 138. A second terminal of capacitor 104 is connected to a common terminal of switch 124. Switch 124 can connect its common terminal to any one of high reference voltage (VrH) node 136, input voltage (VIn) node 137, and low reference voltage (VrL) node 138. A second terminal of capacitor 105 is connected to a common terminal of switch 125. Switch 125 can connect its common terminal to any one of high reference voltage (VrH) node 136, input voltage (VIn) node 137, and low reference voltage (VrL) node 138. A second terminal of capacitor 106 is connected to a common terminal of switch 126. Switch 126 can connect its common terminal to any one of high reference voltage (VrH) node 136, input voltage (VIn) node 137, and low reference voltage (VrL) node 138. A second terminal of capacitor 107 is connected to a common terminal of switch 127. Switch 127 can connect its common terminal to any one of high reference voltage (VrH) node 136, input voltage (VIn) node 137, and low reference voltage (VrL) node 138.

A second terminal of capacitor 118 is connected to common conductor 140, which is connected to a first terminal of each of capacitors 108, 109, 110, 111, and 119. A second terminal of capacitor 108 is connected to a common terminal of switch 128. Switch 128 can connect its common terminal to any one of high reference voltage (VrH) node 136, input voltage (VIn) node 137, and low reference voltage (VrL) node 138. A second terminal of capacitor 109 is connected to a common terminal of switch 129. Switch 129 can connect its common terminal to any one of high reference voltage (VrH) node 136, input voltage (VIn) node 137, and low reference voltage (VrL) node 138. A second terminal of capacitor 110 is connected to a common terminal of switch 130. Switch 130 can connect its common terminal to any one of high reference voltage (VrH) node 136, input voltage (VIn) node 137, and low reference voltage (VrL) node 138. A second terminal of capacitor 111 is connected to a common terminal of switch 131. Switch 131 can connect its common terminal to any one of high reference voltage (VrH) node 136, input voltage (VIn) node 137, and low reference voltage (VrL) node 138.

A second terminal of capacitor 119 is connected to common conductor 143, which is connected to a first terminal of each of capacitors 112, 113, 114, and 115 and to a non-inverting input of comparator 148. A second terminal of capacitor 112 is connected to a common terminal of switch 132. Switch 132 can connect its common terminal to any one of high reference voltage (VrH) node 136, input voltage (VIn) node 137, and low reference voltage (VrL) node 138. A second terminal of capacitor 113 is connected to a common terminal of switch 133. Switch 133 can connect its common terminal to any one of high reference voltage (VrH) node 136, input voltage (VIn) node 137, and low reference voltage (VrL) node 138. A second terminal of capacitor 114 is connected to a common terminal of switch 134. Switch 134 can connect its common terminal to any one of high reference voltage (VrH) node 136, input voltage (VIn) node 137, and low reference voltage (VrL) node 138. A second terminal of capacitor 115 is connected to a common terminal of switch 135. Switch 135 can connect its common terminal to any one of high reference voltage (VrH) node 136, input voltage (VIn) node 137, and low reference voltage (VrL) node 138. The non-inverting input of comparator 148 is connected to a first terminal of switch 145. A second terminal of switch 145 is connected to a common mode voltage (Vcm) at node 147.

Reference (REF) digital-to-analog converter (DAC) 141 is connected to inverting input of comparator 148 at node 142. Node 142 is connected to a first terminal of switch 144. A second terminal of switch 144 is connected to the common mode voltage (Vcm) at node 146.

Calibration circuit 150 is connected to node 151, which is connected to a first terminal of capacitor 116. A second terminal of capacitor 116 is connected to node 153, which is connected to a common terminal of switch 155. Switch 155 can connect its common terminal to any one of high reference voltage (VrH) node 136, input voltage (VIn) node 137, and low reference voltage (VrL) node 138. Calibration circuit 150 is connected to node 152, which is connected to a first terminal of capacitor 117. A second terminal of capacitor 117 is connected to node 154, which is connected to a common terminal of switch 156. Switch 156 can connect its common terminal to any one of high reference voltage (VrH) node 136, input voltage (VIn) node 137, and low reference voltage (VrL) node 138.

An array 120 of capacitive structures, such as capacitors 112, 113, 114, and 115, are arranged on a semiconductor die according to a specified pattern. In accordance with at least one embodiment, each of the capacitive structures can comprise a plurality of capacitive structure subcomponents. The specified pattern can establish the arrangement on the semiconductor die of the several pluralities of capacitive structure subcomponents for the array 120 of the capacitive structures.

Figure 2:
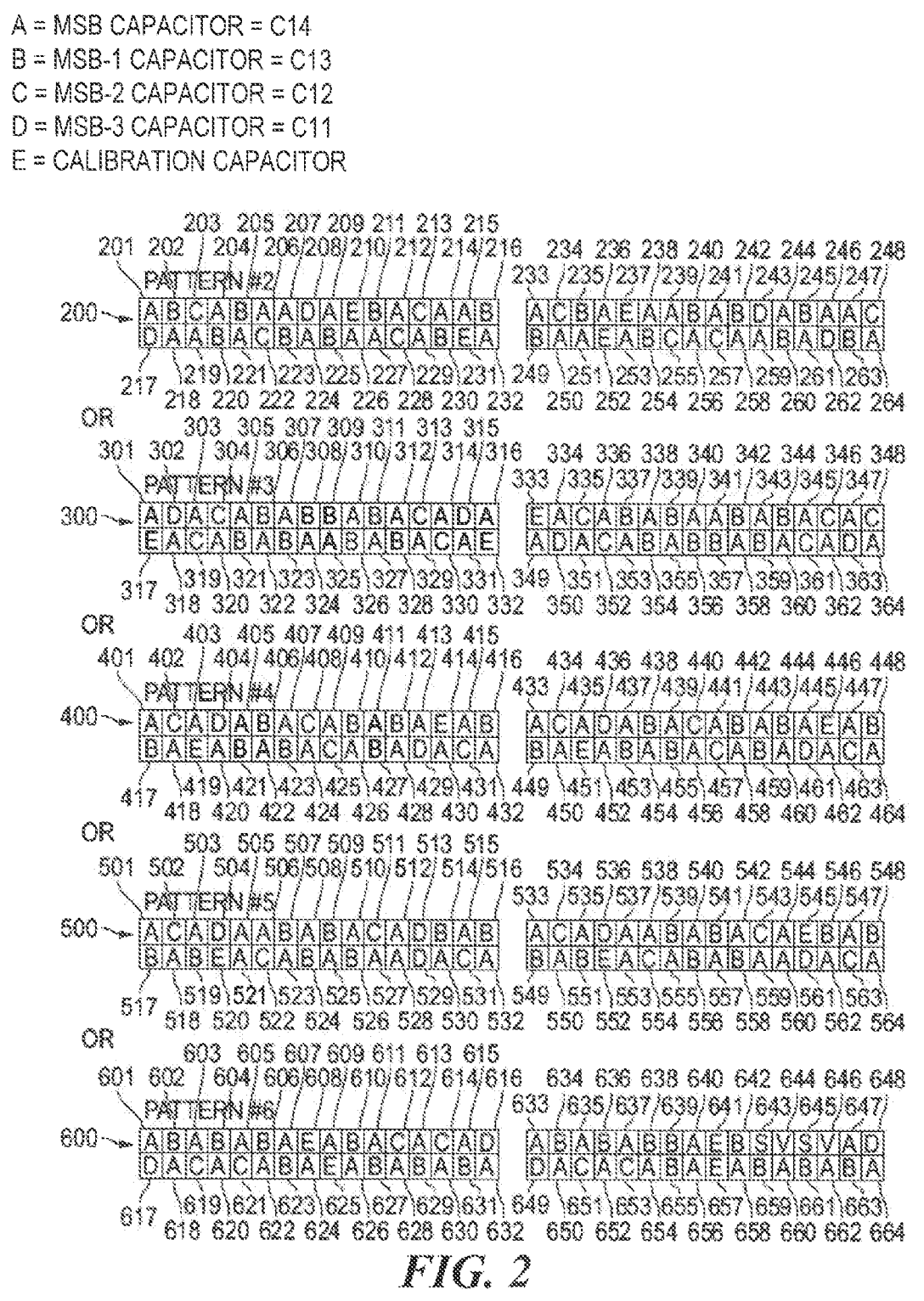

FIG. 2 is a plan view diagram illustrating a plurality of patterns of capacitive structure subcomponents of an array of capacitive structures as situated on a semiconductor die in accordance with at least one embodiment. The capacitive structure subcomponents are illustrated as rectangular blocks to illustrate their spatial relationships to each other. A capacitive structure subcomponent within a block may be implemented, for example, as shown in FIGS. 3-7.

Pattern 200 illustrates an arrangement of capacitive structure subcomponents referred to as pattern #2. In the upper left corner of pattern 200 is capacitive structure subcomponent 201, which is marked with the letter A to show it is a constituent of most significant bit (MSB) capacitor C14, such as capacitor 115 of FIG. 1. To the right of (e.g., displaced along an X axis from) capacitive structure subcomponent 201 is capacitive structure subcomponent 202, which is marked with the letter B to show it is a constituent of second-most significant bit (MSB−1) capacitor C13, such as capacitor 114 of FIG. 1. To the right of capacitive structure subcomponent 202 is capacitive structure subcomponent 203, which is marked with the letter C to show it is a constituent of third-most significant bit (MSB−2) capacitor C12, such as capacitor 113 of FIG. 1. To the right of capacitive structure subcomponent 203 is capacitive structure subcomponent 204, which is marked with the letter A to show it is a constituent of MSB capacitor C14. Next to the right is capacitive structure subcomponent 205, marked with the letter B as a constituent of MSB−1 capacitor C13. Next to the right is capacitive structure subcomponent 206, marked with the letter A as a constituent of MSB capacitor C14. To its right, capacitive structure subcomponent 207 is also marked with the letter A, as it is also a constituent of MSB capacitor C14. Next to the right is capacitive structure subcomponent 208, which is marked with the letter D to show it is a constituent of fourth-most significant bit (MSB−3) capacitor C11, such as capacitor 112 of FIG. 1.

To the right of capacitive structure subcomponent 208 is capacitive structure subcomponent 209, which is marked with the letter A, showing it to be a constituent of MSB capacitor C14. To its right is capacitive structure subcomponent 210, which is marked with the letter E to show it is a constituent of a calibration capacitor, such as calibration capacitor 116. Next to the right is capacitive structure subcomponent 211, which is marked with the letter B to show it is a constituent of MSB−1 capacitor C13. Next to the right is capacitive structure subcomponent 212, which is marked with the letter A to show it is a constituent of MSB capacitor C14. Next to the right is capacitive structure subcomponent 213, which is marked with the letter C to show it is a constituent of MSB−2 capacitor C12. Next to the right is capacitive structure subcomponent 214, which is marked with the letter A to show it is a constituent of MSB capacitor C14. To its right is capacitive structure subcomponent 215, which is marked with the letter A to show it is a constituent of MSB capacitor C14. Next to the right, in the upper right corner of the left half of pattern 200, is capacitive structure subcomponent 216, which is marked with the letter B to show it is a constituent of MSB−1 capacitor C13.

In the lower left corner of pattern 200, adjacent to (e.g., displaced along a Y axis, which is orthogonal to the X axis, from) capacitive structure subcomponent 201 is capacitive structure subcomponent 217, which is marked with the letter D to show it is a constituent of MSB−3 capacitor C11. To the right of capacitive structure subcomponent 217 and adjacent (along the Y axis) to capacitive structure subcomponent 202 is capacitive structure subcomponent 218, which is marked with the letter A to show it is a constituent of MSB capacitor C14. To the right of capacitive structure subcomponent 218 and adjacent (along the Y axis) to capacitive structure subcomponent 203 is capacitive structure subcomponent 219, which is marked with the letter A to show it is a constituent of MSB capacitor C14. To the right of capacitive structure subcomponent 219 and adjacent (along the Y axis) to capacitive structure subcomponent 204 is capacitive structure subcomponent 220, which is marked with the letter B to show it is a constituent of MSB−1 capacitor C13. To the right of capacitive structure subcomponent 220 and adjacent (along the Y axis) to capacitive structure subcomponent 205 is capacitive structure subcomponent 221, which is marked with the letter A to show it is a constituent of MSB capacitor C14. To the right of capacitive structure subcomponent 221 and adjacent (along the Y axis) to capacitive structure subcomponent 206 is capacitive structure subcomponent 222, which is marked with the letter C to show that it is a constituent of MSB−2 capacitor C12. To the right of capacitive structure subcomponent 222 and adjacent (along the Y axis) to capacitive structure subcomponent 207 is capacitive structure subcomponent 223, which is marked with the letter B to show that it is a constituent of MSB−1 capacitor C13. To the right of capacitive structure subcomponent 223 and adjacent (along the Y axis) to capacitive structure subcomponent 208 is capacitive structure subcomponent 224, which is marked with the letter A to show that it is a constituent of MSB capacitor C14. To the right of capacitive structure subcomponent 224 and adjacent (along the Y axis) to capacitive structure subcomponent 209 is capacitive structure subcomponent 225, which is marked with the letter B to shown it is a constituent of MSB−1 capacitor C13. To the right of capacitive structure subcomponent 225 and adjacent (along the Y axis) to capacitive structure subcomponent 210 is capacitive structure subcomponent 226, which is marked with the letter A to shown that it is a constituent of MSB capacitor C14. To the right of capacitive structure subcomponent 226 and adjacent (along the Y axis) to capacitive structure subcomponent 211 is capacitive structure subcomponent 227, which is marked with the letter A to show that it is a constituent of MSB capacitor C14. To the right of capacitive structure subcomponent 227 and adjacent (along the Y axis) to capacitive structure subcomponent 212 is capacitive structure subcomponent 228, which is marked with the letter C to show that it is a constituent of MSB-2 capacitor C12. To the right of capacitive structure subcomponent 228 and adjacent (along the Y axis) to capacitive structure subcomponent 213 is capacitive structure subcomponent 229, which is marked with the letter A to show that it is a constituent of MSB capacitor C14. To the right of capacitive structure subcomponent 229 and adjacent (along the Y axis) to capacitive structure subcomponent 214 is capacitive structure subcomponent 230, which is marked with the letter B to show that it is a constituent of MSB-1 capacitor C13. To the right of capacitive structure subcomponent 230 and adjacent (along the Y axis) to capacitive structure subcomponent 215 is capacitive structure subcomponent 231, which is marked with the letter E to show that it is a constituent of a calibration capacitor, such as calibration capacitor 116. To the right of capacitive structure subcomponent 231 and adjacent (along the Y axis) to capacitive structure subcomponent 216 is capacitive structure 232, which is marked with the letter A to show that it is a constituent of MSB capacitor C14, in the lower right corner of the left half of pattern 200.

In the upper left corner of the right half of pattern 200, adjacent to or near capacitive structure subcomponent 216, is capacitive structure subcomponent 233, which is marked with the letter A to show that it is a constituent of MSB capacitor C14. To the right of capacitive structure subcomponent 233 is capacitive structure subcomponent 234, which is marked with the letter C to show that it is a constituent of MSB-2 capacitor C12. To the right of capacitive structure subcomponent 234 is capacitive structure subcomponent 235, which is marked with the letter B to show that it is a constituent of MSB-1 capacitor C13. To the right of capacitive structure subcomponent 235 is capacitive structure subcomponent 236, which is marked with the letter A to show that it is a constituent of MSB capacitor C14. To the right of capacitive structure subcomponent 236 is capacitive structure subcomponent 237, which is marked with letter E to show that it is a constituent of a calibration capacitor, such as calibration capacitor 116 or 117. To the right of capacitive structure subcomponent 237 is capacitive structure subcomponent 238 and then capacitive structure subcomponent 239, both of which are marked with the letter A to show that they are both constituents of MSB capacitor C14. To the right of capacitive structure subcomponent 239 is capacitive structure subcomponent 240, which is marked with the letter B to show that it is a constituent of MSB-1 capacitor C13. To the right of capacitive structure subcomponent 240 is capacitive structure subcomponent 241, which is marked with the letter A to show that a constituent of MSB capacitor C14. To the right of capacitive structure subcomponent 241 is capacitive structure subcomponent 242, which is marked with the letter B to show that it is a constituent of MSB-1 capacitor C13. To the right of capacitive structure subcomponent 242 is capacitive structure subcomponent 243, which is marked with the letter D to show that it is a constituent of MSB-3 capacitor C11. To the right of capacitive structure subcomponent 243 is capacitive structure subcomponent 244, which is marked with the letter A to show that it is a constituent of MSB capacitor C14. To the right of capacitive structure subcomponent 244 is capacitive structure subcomponent 245, which is marked with the letter B to show that it is a constituent of MSB-1 capacitor C13. To the right of capacitive structure subcomponent 245 is capacitive structure subcomponent 246 and then capacitive structure subcomponent 247, both of which are marked with the letter A to show that they are both constituents of MSB capacitor C14. To the right of capacitive structure subcomponent 247 is capacitive structure subcomponent 248, which is marked with the letter C to show that it is a constituent of MSB-2 capacitor C12.

Adjacent to the row of capacitive structure subcomponents 233-248 is another row of capacitive structure subcomponents 249-264. Each of capacitive structure subcomponents 249-264 is offset along the Y axis from a corresponding one of capacitive structure subcomponents 233-248. At the lower right corner of the right half of pattern 200 is capacitive structure subcomponent 264, which is marked with the letter A, along with capacitive structure subcomponents 250, 251, 253, 256, 258, 259, and 261, to show that they are constituents of MSB capacitor C14. At the lower left corner of the right half of pattern 200 is capacitive structure subcomponent 249, which is marked, along with capacitive structure subcomponents 253, 260, and 263, with the letter B to show that they are constituents of MSB-1 capacitor C13. At the seventh and ninth positions from the left in the row are capacitive structure subcomponents 255 and 257, both marked with the letter C to shown that they are constituents of MSB-2 capacitor C12. Third from the right end of the row is capacitive structure subcomponent 262, which is marked with the letter D to show that it is a constituent of MSB-3 capacitor C11. Fourth from the left end of the row is capacitive structure subcomponent 252, which is marked with the letter E to show that it is a constituent of a calibration capacitor, such as calibration capacitor 116 or calibration capacitor 117.

As with the description of pattern 200 above, the descriptions of patterns 300, 400, 500, and 600 below use similar letter markings of capacitive structure subcomponents to indicate the capacitors of which the respectively marked capacitive structure subcomponents are constituents. As above, the letter marking A denotes MSB capacitor C14, the letter marking B denotes MSB-1 capacitor C13, the letter marking C denotes MSB-2 capacitor C12, the letter marking D denotes MSB-3 capacitor C11, and the letter marking E denotes a calibration capacitor.

Pattern 300 comprises an array of capacitive structure subcomponents 301-364 arranged in two rows and 32 columns. A left half of a first row includes capacitive structure subcomponents 301-316 and begins, in the upper left corner of pattern 300, with capacitive structure subcomponent 301, continuing to the right (along the X axis) to capacitive structure subcomponent 316 in the upper right corner of the left half of pattern 300. A left half of a second row is aligned with, but displaced along the Y axis (which is orthogonal to the X axis) from, the left half of the first row. Each of capacitive structure subcomponents 317-332 of the second row of the left half of pattern 300 is aligned with but displaced from a corresponding one of capacitive structure subcomponents 301-316 of the first row of the left half of pattern 300.

A right half of the first row includes capacitive structure subcomponents 333-348 and begins, in the upper left corner of the right half of pattern 300, with capacitive structure subcomponent 333, continuing to the right (along the X axis) to capacitive structure subcomponent 348 in the upper right corner of pattern 300. A right half of the second row is aligned with, but displaced along the Y axis (which is orthogonal to the X axis) from, the right half of the first row. Each of capacitive structure subcomponents 349-364 of the second row of the right half of pattern 300 is aligned with but displaced from a corresponding one of capacitive structure subcomponents 333-348 of the first row of the right half of pattern 300.

Reading from left to right, from capacitive structure subcomponent 301 to capacitive structure subcomponent 316, the capacitive structure subcomponents 301-316 are marked with a corresponding letter of the sequence ADA-CABABBABACADA. Reading from left to right, from capacitive structure subcomponent 317 to capacitive structure subcomponent 332, the capacitive structure subcomponents 317-332 are marked with a corresponding letter of the sequence EACABABAABABACAE. Reading from left to right, from capacitive structure subcomponent 333 to capacitive structure subcomponent 348, the capacitive structure subcomponents 333-348 are marked with a corresponding letter of the sequence EACABABAABABACAE. Reading from left to right, from capacitive structure subcomponent 349 to capacitive structure subcomponent 364, the capacitive structure subcomponents 349-364 are marked with a corresponding letter of the sequence ADA-CABABBABACADA.

Pattern 400 comprises an array of capacitive structure subcomponents 401-464 arranged in two rows and 32 columns. A left half of a first row includes capacitive structure subcomponents 401-416 and begins, in the upper left corner of pattern 400, with capacitive structure subcomponent 401, continuing to the right (along the X axis) to capacitive structure subcomponent 416 in the upper right corner of the left half of pattern 400. A left half of a second row is aligned with, but displaced along the Y axis (which is orthogonal to the X axis) from, the left half of the first row. Each of capacitive structure subcomponents 417-432 of the second row of the left half of pattern 400 is aligned with but displaced from a corresponding one of capacitive structure subcomponents 401-416 of the first row of the left half of pattern 400.

A right half of the first row includes capacitive structure subcomponents 433-448 and begins, in the upper left corner of the right half of pattern 400, with capacitive structure subcomponent 433, continuing to the right (along the X axis) to capacitive structure subcomponent 448 in the upper right corner of pattern 400. A right half of the second row is aligned with, but displaced along the Y axis (which is orthogonal to the X axis) from, the right half of the first row. Each of capacitive structure subcomponents 449-464 of the second row of the right half of pattern 400 is aligned with but displaced from a corresponding one of capacitive structure subcomponents 433-448 of the first row of the right half of pattern 400.

Reading from left to right, from capacitive structure subcomponent 401 to capacitive structure subcomponent 416, the capacitive structure subcomponents 401-416 are marked with a corresponding letter of the sequence ACADABACABABAEAB. Reading from left to right, from capacitive structure subcomponent 417 to capacitive structure subcomponent 432, the capacitive structure subcomponents 417-432 are marked with a corresponding letter of the sequence BAEABABACABADACA. Reading from left to right, from capacitive structure subcomponent 433 to capacitive structure subcomponent 448, the capacitive structure subcomponents 433-448 are marked with a corresponding letter of the sequence ACADABACABABAEAB. Reading from left to right, from capacitive structure subcomponent 449 to capacitive structure subcomponent 464, the capacitive structure subcomponents 449-464 are marked with a corresponding letter of the sequence BAEA-BABACABADACA.

Pattern 500 comprises an array of capacitive structure subcomponents 501-564 arranged in two rows and 32 columns. A left half of a first row includes capacitive structure subcomponents 501-516 and begins, in the upper left corner of pattern 500, with capacitive structure subcomponent 501, continuing to the right (along the X axis) to capacitive structure subcomponent 516 in the upper right corner of the left half of pattern 500. A left half of a second row is aligned with, but displaced along the Y axis (which is orthogonal to the X axis) from, the left half of the first row. Each of capacitive structure subcomponents 517-532 of the second row of the left half of pattern 500 is aligned with but displaced from a corresponding one of capacitive structure subcomponents 501-516 of the first row of the left half of pattern 500.

A right half of the first row includes capacitive structure subcomponents 533-548 and begins, in the upper left corner of the right half of pattern 500, with capacitive structure subcomponent 533, continuing to the right (along the X axis) to capacitive structure subcomponent 548 in the upper right corner of pattern 500. A right half of the second row is aligned with, but displaced along the Y axis (which is orthogonal to the X axis) from, the right half of the first row. Each of capacitive structure subcomponents 549-564 of the second row of the right half of pattern 500 is aligned with but displaced from a corresponding one of capacitive structure subcomponents 533-548 of the first row of the right half of pattern 500.

Reading from left to right, from capacitive structure subcomponent 501 to capacitive structure subcomponent 516, the capacitive structure subcomponents 501-516 are marked with a corresponding letter of the sequence ACADAABABACAEBAB. Reading from left to right, from capacitive structure subcomponent 517 to capacitive structure subcomponent 532, the capacitive structure subcomponents 517-532 are marked with a corresponding letter of the sequence BABEACABABAADACA. Reading from left to right, from capacitive structure subcomponent 533 to capacitive structure subcomponent 548, the capacitive structure subcomponents 533-548 are marked with a corresponding letter of the sequence ACADAABABACAEBAB. Reading from left to right, from capacitive structure subcomponent 549 to capacitive structure subcomponent 564, the capacitive structure subcomponents 549-564 are marked with a corresponding letter of the sequence BABEACABABAADACA.

Pattern 600 comprises an array of capacitive structure subcomponents 601-664 arranged in two rows and 32 columns. A left half of a first row includes capacitive structure subcomponents 601-616 and begins, in the upper left corner of pattern 600, with capacitive structure subcomponent 601, continuing to the right (along the X axis) to capacitive structure subcomponent 616 in the upper right corner of the left half of pattern 600. A left half of a second row is aligned with, but displaced along the Y axis (which is orthogonal to the X axis) from, the left half of the first row. Each of capacitive structure subcomponents 617-632 of the second row of the left half of pattern 600 is aligned with but displaced from a corresponding one of capacitive structure subcomponents 601-616 of the first row of the left half of pattern 600.

A right half of the first row includes capacitive structure subcomponents 633-648 and begins, in the upper left corner of the right half of pattern 600, with capacitive structure subcomponent 633, continuing to the right (along the X axis) to capacitive structure subcomponent 648 in the upper right corner of pattern 600. A right half of the second row is aligned with, but displaced along the Y axis (which is orthogonal to the X axis) from, the right half of the first row. Each of capacitive structure subcomponents 649-664 of the second row of the right half of pattern 600 is aligned with but displaced from a corresponding one of capacitive structure subcomponents 633-648 of the first row of the right half of pattern 600.

Reading from left to right, from capacitive structure subcomponent 601 to capacitive structure subcomponent 616, the capacitive structure subcomponents 601-616 are marked with a corresponding letter of the sequence ABABABAEABACACAD. Reading from left to right, from capacitive structure subcomponent 617 to capacitive structure subcomponent 632, the capacitive structure subcomponents 617-632 are marked with a corresponding letter of the sequence DACACABAEABABABA. Reading from left to right, from capacitive structure subcomponent 633 to capacitive structure subcomponent 648, the capacitive structure subcomponents 633-648 are marked with a corresponding letter of the sequence ABABABAEABACACAD. Reading from left to right, from capacitive structure subcomponent 649 to capacitive structure subcomponent 664, the capacitive structure subcomponents 649-664 are marked with a corresponding letter of the sequence DACACABAEABABABA.

As can be seen from patterns 300, 400, 500, and 600, in some embodiments, the sequence for the first row of the left side of the pattern can be repeated, either in the same order or in reversed order, in one or more other quadrants of the pattern, such as the second row of the left side, or the first or second row of the right side. As can be seen from patterns 400, 500, and 600, in some embodiments, the sequence for the first row of the left side of the pattern can be repeated in reversed order as the sequence for the second row of the left side, in the same (non-reversed) order as the sequence for the first row of the right side, and in reversed order as the sequence for the second row of the right side. As can be seen from pattern 200, the sequences of the four quadrants can be different from one another. While the left side and right side of each of patterns 200, 300, 400, 500, and 600 are shown with a gap between them, such gap need not be physically present in a topology of an array of capacitive structure subcomponents. While the capacitive structure subcomponents of each of the left half and the right half are shown without gaps between them, a topology of an array of capacitive structure subcomponents can include gaps between any or all of the capacitive structure subcomponents.

In each of the patterns 200, 300, 400, 500, and 600 shown in FIG. 2, a first capacitive structure comprises capacitive structure subcomponents denoted by the letter "A" with first terminals connected with selective switch 135 to one another and second terminals connected to a common conductor 143. A second capacitive structure comprises capacitive structure subcomponents denoted by the letter "B" with first terminals connected with selective switch 134 to one another, and second terminals connected to the common conductor 143. A nominal capacitive value of each of the first capacitive structure subcomponents "A" is a multiple of a nominal capacitive value of each of the second capacitive structure subcomponents "B". The first and second capacitive structure subcomponents "A" and "B" are arranged in an array in which no more than two of the first capacitive structure subcomponents "A" are directly adjacent to one another in a first direction in the array.

Further, in some embodiments, none of the first capacitive structure subcomponents "A" are directly adjacent to one another in a second direction in the array. The second direction is orthogonal to the first direction, which is shown by a first row of the array being above a second row of the array. For example, none of the first capacitive structure subcomponents "A" in the first row have a first capacitive structure subcomponent "A" below them in the second row of each of patterns 200-600 in FIG. 2.

In some embodiments, no more than one of the first capacitive structure subcomponents "A" is directly adjacent to another of the first capacitive structure subcomponents "A" in a second direction in the array. The second direction is orthogonal to the first direction. For example, elements 218/219 and 226/227 of the second row of pattern 200 show two first capacitive structure subcomponents "A" next to each other.

In further embodiments, none of the second plurality of capacitive structure subcomponents "B" are directly adjacent to one another in the first direction in the array, as shown by the first row being above the second row in pattern 200. In addition, none of the second capacitive structure subcomponents "B" are directly adjacent to (above or below) one another in the first and second rows of pattern 200.

Looking further at patterns 200-600, a third capacitive structure comprises a third set of capacitive structure subcomponents "C" in the array. A nominal capacitive value of each of the first capacitive structure subcomponents "A" is a second multiple of a nominal capacitive value of each of the third capacitive structure subcomponents "C". None of the third capacitive structure subcomponents "C" are directly adjacent to one another along the top row or in the first direction of pattern 200. In addition, none of the third capacitive structure subcomponents "C" in the array are directly adjacent to one another in the second direction (e.g., top and bottom rows).

In some further embodiments, a fourth capacitive structure comprises a set of fourth capacitive structure subcomponents "D" in the array. A nominal capacitive value of each of the first capacitive structure subcomponents "A" is a third multiple of a nominal capacitive value of each of the fourth capacitive structure subcomponents "D". None of the fourth capacitive structure subcomponents "D" are directly adjacent to one another in the first direction. In addition, none of the fourth capacitive structure subcomponents "D" in the array may be directly adjacent to one another in the second direction in the array, i.e., between first and second rows of the array.

As an example of the nominal capacitance values of the first, second, third and fourth capacitive structures, the first capacitive structure ("A" capacitive subcomponents) can have a first nominal capacitance value of twice a second nominal capacitance value of the second capacitive structure ("B" capacitive subcomponents). The second nominal capacitance value can be twice a third nominal capacitance value of the third capacitive structure ("C" capacitive subcomponents), and the third nominal capacitance value can be twice a fourth nominal capacitance of the fourth capacitive structure ("D" capacitive subcomponents). Other suitable multiples of capacitance values can be used, however.

Figure 3:
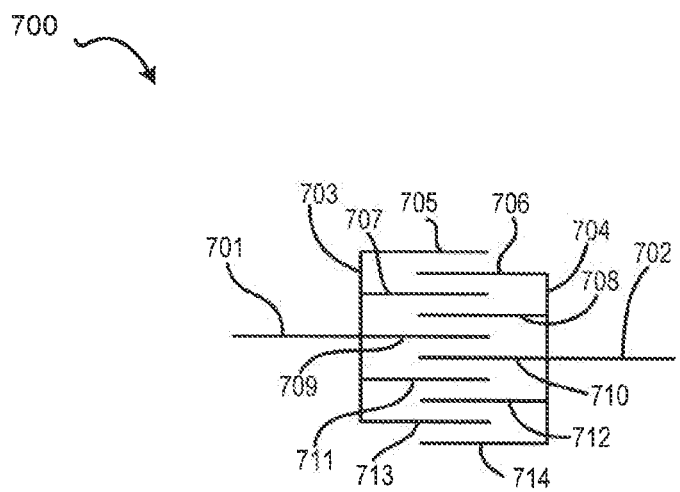
FIG. 3 is a plan view diagram of a single layer of a capacitive structure subcomponent of an array of capacitive structures in accordance with at least one embodiment.

FIG. 3 is a plan view diagram of a single layer of a capacitive structure subcomponent of an array of capacitive structures in accordance with at least one embodiment. In accordance with at least one embodiment, a capacitive structure subcomponent can be fabricated on a plurality of layers, and structures defined in those layers can be connected together (e.g., in parallel) to form the capacitive structure subcomponent. Structure 700 is an interdigitated capacitive structure having a first terminal 701 and a second terminal 702. The first terminal 701 is connected to a lateral conductor 703, which is connected to capacitive conductors 705, 707, 709, 711, and 713. The second terminal 702 is connected to a lateral conductor 704, which is connected to capacitive conductors 706, 708, 710, 712, and 714. Capacitive conductors 705, 707, 709, 711, and 713 are parallel to, spaced apart from, and interdigitated with, capacitive conductors 706, 708, 710, 712, and 714.

Figure 4:
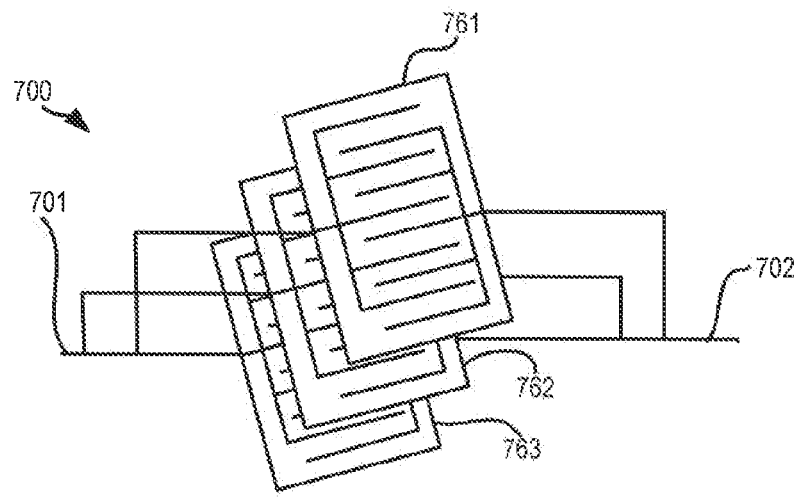
FIG. 4 is an exploded perspective view diagram of a stack of multiple layers of a capacitive structure subcomponent of an array of capacitive structures in accordance with at least one embodiment.

FIG. 4 is an exploded perspective view diagram of a stack of multiple layers of a capacitive structure subcomponent of an array of capacitive structures in accordance with at least one embodiment. A plurality of single layers of a capacitive structure subcomponent can be connected together, for example, in parallel, to form a capacitive structure subcomponent. In accordance with at least one embodiment, the plurality of single layers can be stacked above and below one another. As an example, the stack can be implemented on multiple metallization layers of an integrated circuit (IC). In stack 800, a first terminal 701 is connected to a first terminal of each of layers 761, 762, and 763, and a second terminal 702 is connected to a second terminal of each of layers 761, 762, and 763. Such connections are represented schematically to accommodate the exaggerated dimensions of the exploded perspective view diagram.

Figure 5:
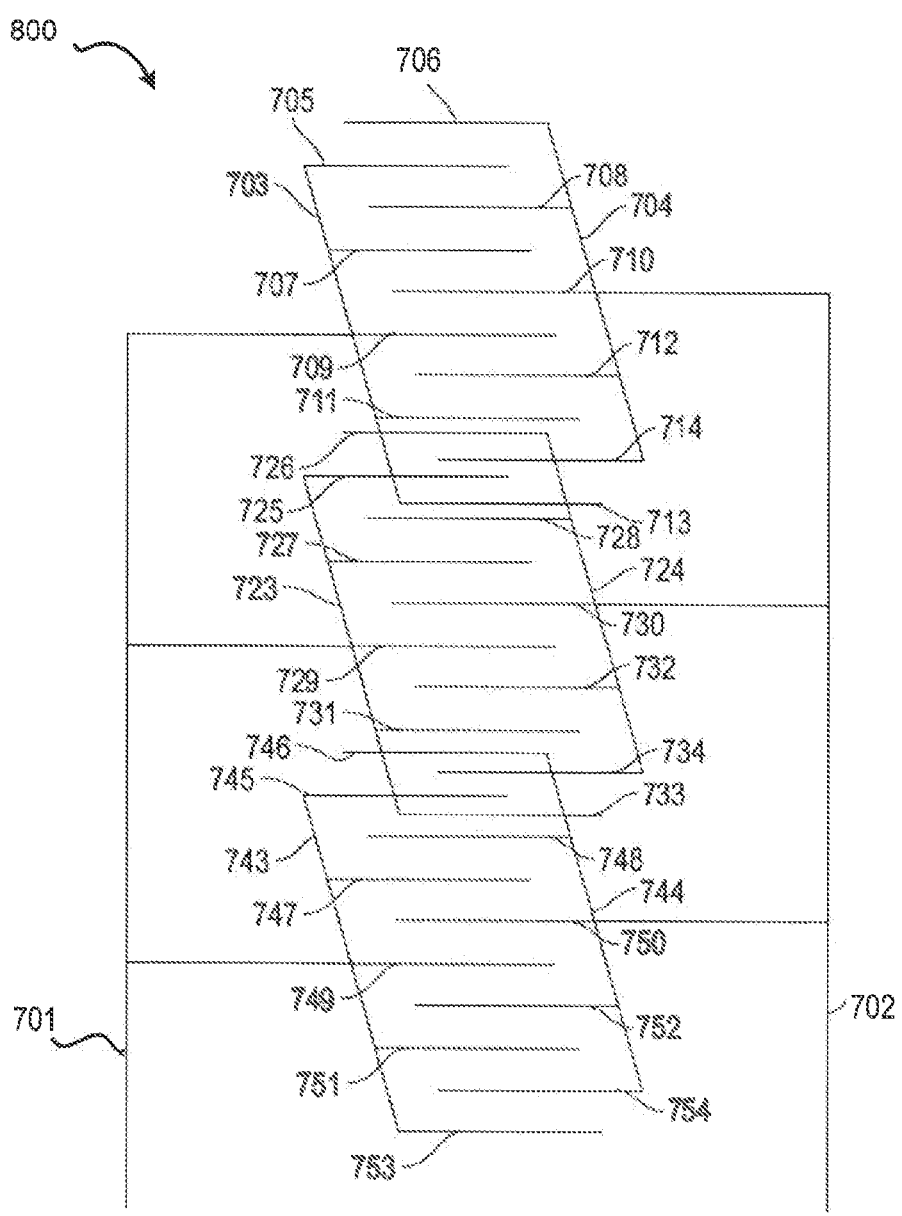
FIG. 5 is an exploded perspective view diagram of a stack of multiple single-layer portions of a capacitive structure subcomponent of an array of capacitive structures in accordance with at least one embodiment.

FIG. 5 is an exploded perspective view diagram of a stack of multiple single-layer portions of a capacitive structure subcomponent of an array of capacitive structures in accordance with at least one embodiment. In stack 800, on a first layer, first electrode 701 is connected to lateral conductor 703, which is connected to each of capacitive conductors 705, 707, 709, 711, and 713, and second electrode 702 is connected to lateral conductor 704, which is connected to each of capacitive conductors 706, 708, 710, 712, and 714. On a second layer, first electrode 701 is connected to lateral conductor 723, which is connected to each of capacitive conductors 725, 727, 729, 731, and 733, and second electrode 702 is connected to lateral conductor 724, which is connected to each of capacitive conductors 726, 728, 730, 732, and 734. On a third layer, first electrode 701 is connected to lateral conductor 743, which is connected to each of capacitive conductors 745, 747, 749, 751, and 753, and second electrode 702 is connected to lateral conductor 744, which is connected to each of capacitive conductors 746, 748, 750, 752, and 754.

Figure 6:
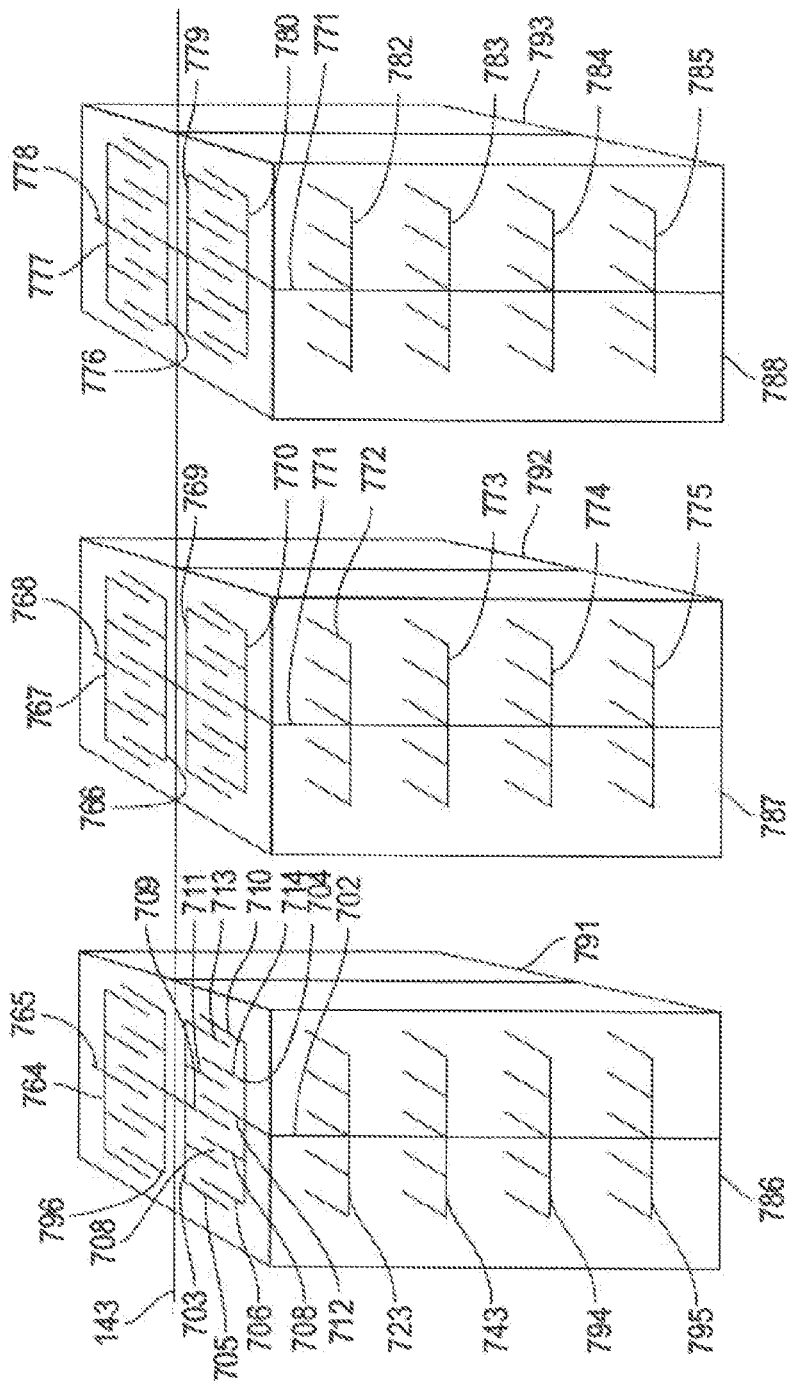
FIG. 6 is a perspective view diagram of a portion of an array of capacitive structures in accordance with at least one embodiment.

FIG. 6 is a perspective view diagram of a portion of an array of capacitive structures in accordance with at least one embodiment. In portion 1000 of an array of capacitive structures, each of a plurality of capacitive structure subcomponents can be connected via a respective one of its terminals to a common conductor 143 in common with each other. Common conductor 143 is connected to first terminal of a first layer of first capacitive structure subcomponent 786, to first terminal of a first layer of second capacitive structure subcomponent 787, to first terminal of a first layer of third capacitive structure subcomponent 788, to first terminal of a first layer of fourth capacitive structure subcomponent 791, to first terminal of a first layer of fifth capacitive structure subcomponent 792, and to first terminal of a first layer of sixth capacitive structure subcomponent 793. Common conductor 143 can also be connected to a first terminal of other layers of each of the capacitive structure subcomponents (not shown). The first terminal of the first layer of first capacitive structure subcomponent 786 is connected to lateral conductor 703 of the first layer of first capacitive structure subcomponent 786. The first terminal of the first layer of second capacitive structure subcomponent 787 is connected to lateral conductor 769 of the first layer of second capacitive structure subcomponent 787. The first terminal of the first layer of third capacitive structure subcomponent 788 is connected to lateral conductor 779 of the first layer of third capacitive structure subcomponent 788. The first terminal of the first layer of fourth capacitive structure subcomponent 791 is connected to lateral conductor 796 of the first layer of fourth capacitive structure subcomponent 791. The first terminal of the first layer of fifth capacitive structure subcomponent 792 is connected to lateral conductor 766 of the first layer of fifth capacitive structure subcomponent 792. The first terminal of the first layer of sixth capacitive structure subcomponent 793 is connected to lateral conductor 776 of a first layer of sixth capacitive structure subcomponent 793.

The first terminal of the first layer of first capacitive structure subcomponent 786 is connected to a first terminal of each of other layers of first capacitive structure subcomponent 786. The first terminal of the first layer of second capacitive structure subcomponent 787 is connected to a first terminal of each of other layers of second capacitive structure subcomponent 787. The first terminal of the first layer of third capacitive structure subcomponent 788 is connected to a first terminal of each of other layers of third capacitive structure subcomponent 788. The first terminal of the first layer of fourth capacitive structure subcomponent 791 is connected to a first terminal of each of other layers of fourth capacitive structure subcomponent 791. The first terminal of the first layer of fifth capacitive structure subcomponent 792 is connected to a first terminal of each of other layers of fifth capacitive structure subcomponent 792. The first terminal of the first layer of sixth capacitive structure subcomponent 793 is connected to a first terminal of each of other layers of sixth capacitive structure subcomponent 793.

The second terminal of the first layer of first capacitive structure subcomponent 786 is connected to a second terminal of each of other layers of first capacitive structure subcomponent 786. The second terminal of the first layer of second capacitive structure subcomponent 787 is connected to a second terminal of each of other layers of second capacitive structure subcomponent 787. The second terminal of the first layer of third capacitive structure subcomponent 788 is connected to a second terminal of each of other layers of third capacitive structure subcomponent 788. The second terminal of the first layer of fourth capacitive structure subcomponent 791 is connected to a second terminal of each of other layers of fourth capacitive structure subcomponent 791. The second terminal of the first layer of fifth capacitive structure subcomponent 792 is connected to a second terminal of each of other layers of fifth capacitive structure subcomponent 792. The second terminal of the first layer of sixth capacitive structure subcomponent 793 is connected to a second terminal of each of other layers of sixth capacitive structure subcomponent 793.

The second terminal 702 of the first layer of first capacitive structure subcomponent 786 is connected to lateral conductor 704 of the first layer of first capacitive structure subcomponent 786, to lateral conductor 723 of the second layer of first capacitive structure subcomponent 786, to lateral conductor 743 of the third layer of first capacitive structure subcomponent 786, to lateral conductor 794 of the fourth layer of first capacitive structure subcomponent 786, and to lateral conductor 795 of the fifth layer of first capacitive structure subcomponent 786. The second terminal 771 of the first layer of second capacitive structure subcomponent 787 is connected to lateral conductor 770 of the first layer of second capacitive structure subcomponent 787, to lateral conductor 772 of the second layer of second capacitive structure subcomponent 787, to lateral conductor 773 of the third layer of second capacitive structure subcomponent 787, to lateral conductor 774 of the fourth layer of second capacitive structure subcomponent 787, and to lateral conductor 775 of the fifth layer of second capacitive structure subcomponent 787. The second terminal 781 of the first layer of third capacitive structure subcomponent 788 is connected to lateral conductor 780 of the first layer of third capacitive structure subcomponent 788, to lateral conductor 782 of the second layer of third capacitive structure subcomponent 788, to lateral conductor 783 of the third layer of third capacitive structure subcomponent 788, to lateral conductor 784 of the fourth layer of third capacitive structure subcomponent 788, and to lateral conductor 785 of the fifth layer of third capacitive structure subcomponent 788. The second terminal 765 of the first layer of fourth capacitive structure subcomponent 791 is connected to lateral conductor 764 of the first layer of fourth capacitive structure subcomponent 791. The second terminal 768 of the first layer of fifth capacitive structure subcomponent 792 is connected to lateral conductor 767 of the first layer of fifth capacitive structure subcomponent 792. The second terminal 778 of the first layer of sixth capacitive structure subcomponent 793 is connected to lateral conductor 777 of a first layer of sixth capacitive structure subcomponent 793.

Figure 7:
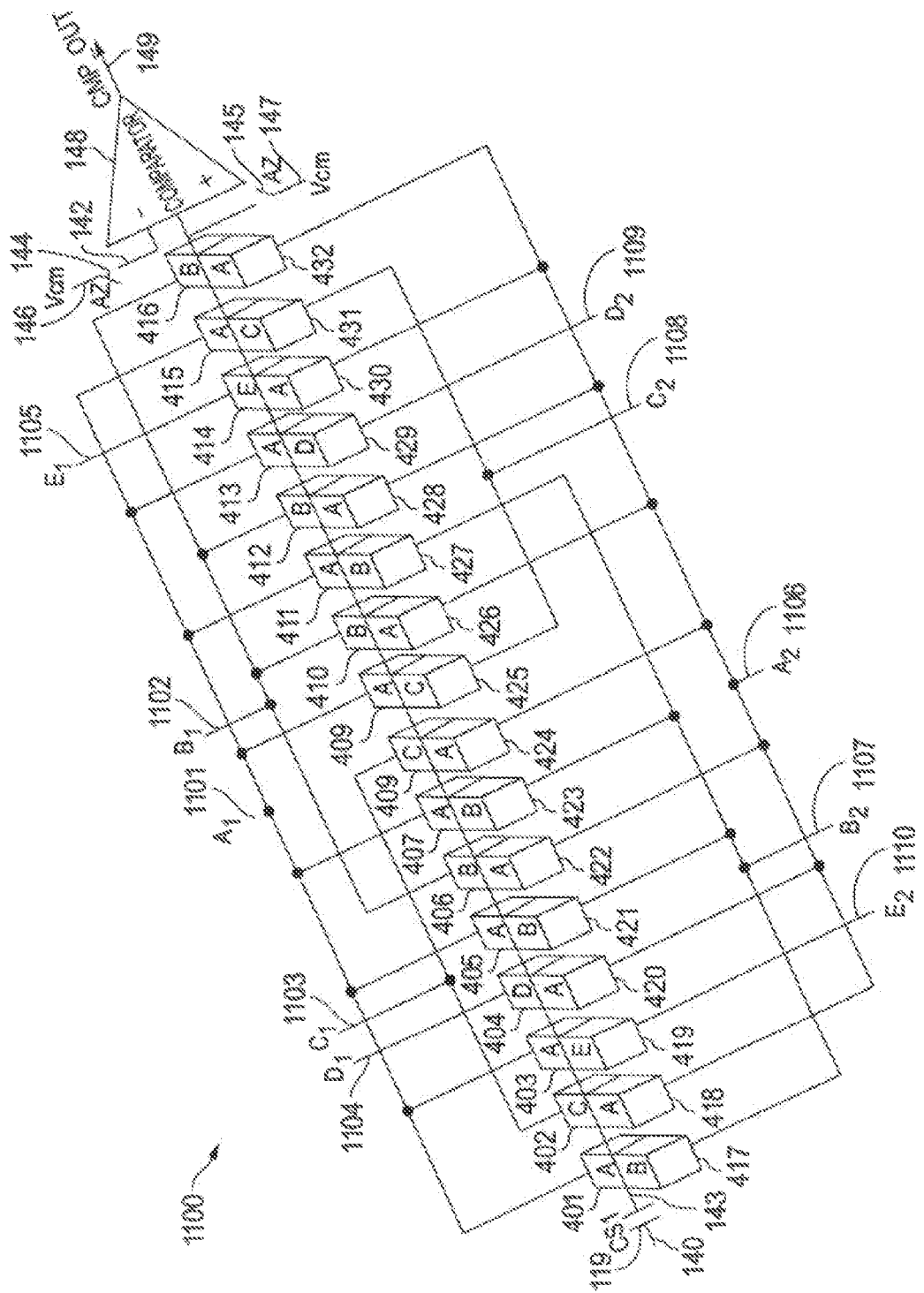
FIG. 7 is a schematic diagram of a first portion of a circuit comprising an array of capacitive structures in accordance with at least one embodiment.

FIG. 7 is a schematic diagram of a circuit comprising an array of capacitive structures in accordance with at least one embodiment. Circuit 1100 comprises capacitive structure 119, capacitive structure subcomponents 401-432, comparator 148, and switches 144 and 145. Common conductor 140 is connected to a first terminal of capacitive structure 119. A second terminal of capacitive structure 119 is connected to common conductor 143. Common conductor 143 is connected to a first terminal of each of capacitive structure subcomponents 401-432, to a non-inverting input of comparator 148, and to a first terminal of switch 145. A second terminal of switch 145 is coupled to common mode voltage (Vcm) 147. Node 142 is connected to an inverting input of comparator 148 and to a first terminal of switch 144. A second terminal of switch 144 is connected to common mode voltage (Vcm) 146. An output of comparator 148 is connected to node 149.

A second terminal of each of capacitive structure subcomponents 401, 403, 405, 407, 409, 411, 413, and 415 is connected to node 1101, which is labeled $A_1$. A second terminal of each of capacitive structure subcomponents 418, 420, 422, 424, 426, 428, 430, and 432 is coupled to node 1106, which is labeled $A_2$. A second terminal of each of capacitive structure subcomponents 406, 410, 412, and 416 is connected to node 1102, which is labeled $B_1$. A second terminal of each of capacitive structure subcomponents 417, 421, 423, and 427 is connected to node 1107, which is labeled $B_2$. A second terminal of each of capacitive structure subcomponents 402 and 408 is coupled to node 1103, which is labeled $C_1$. A second terminal of each of capacitive structure subcomponents 425 and 431 is connected to node 1108, which is labeled $C_2$. A second terminal of capacitive structure subcomponent 404 is connected to node 1104, which is labeled $D_1$. A second terminal of capacitive structure subcomponent 429 is connected to node 1109, which is labeled $D_2$. A second terminal of capacitive structure subcomponent 414 is connected to node 1105, which is labeled $E_1$. A second terminal of capacitive structure subcomponent 419 is connected to node 1110, which is labeled $E_2$.

Figure 8:
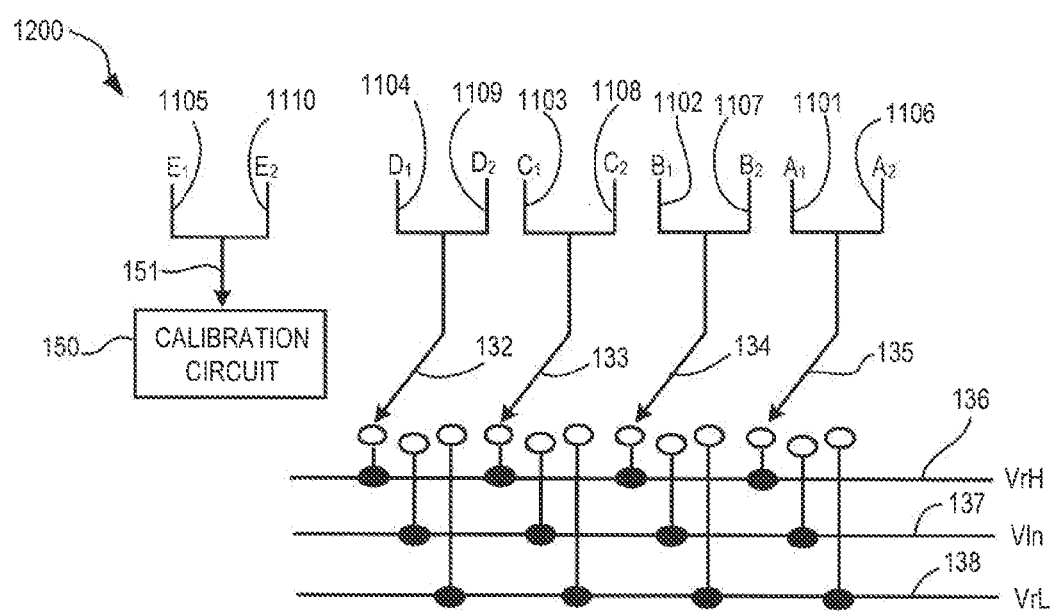
FIG. 8 is a schematic diagram of a second portion of the circuit of which the first portion is shown in FIG. 7 in accordance with at least one embodiment.

FIG. 8 is a schematic diagram of a second portion of the circuit of which the first portion is shown in FIG. 7 in accordance with at least one embodiment. Circuit 1200 comprises switches 132, 133, 134, and 135 and calibration circuit 150. Node 1101, labeled $A_1$, and node 1106, labeled $A_2$, are connected to a common terminal of switch 135. Node 1102, labeled $B_1$, and node 1107, labeled $B_2$, are connected to a common terminal of switch 134. Node 1103, labeled $C_1$, and node 1108, labeled $C_2$, are connected to a common terminal of switch 133. Node 1104, labeled $D_1$, and node 1109, labeled $D_2$, are connected to a common terminal of switch 132. Node 1105, labeled $E_1$, and node 1110, labeled $E_2$, are connected to node 151, which is connected to calibration circuit 150. Each of switches 132, 133, 134, and 135 can selectively connect its common terminal to one of high reference voltage (VrH) 136, input voltage (VIn) 137, and low reference voltage (VrL) 138.

In accordance with at least one embodiment, layout patterns and styles useful to achieve better matching, integral nonlinearity (INL), and differential nonlinearity (DNL) results within the MSB array of a three segmented 4-4-4(3) SAR ADC are described.

At least one embodiment can be used to optimize the matching and subsequent performance of the multiplying digital-to-analog converter (MDAC) subarray within, for example, a three-segmented-array digital-to-analog converter (DAC) (e.g., 4-4-4) design by improving the matching within the MDAC array (C14, C13, C12, C11).

In accordance with one aspect of at least one embodiment, it can be advantageous to maximize dispersion. Maximizing dispersion can provide better matching through averaging out gradient-induced errors.

In accordance with one aspect of at least one embodiment, it can be advantageous to maximize capacitor finger spacing in an interdigitated capacitive structure. Maximizing capacitor finger spacing can provide better matching without increasing capacitance.

In accordance with one aspect of at least one embodiment, an array can be fabricated with only two rows to minimize top plate parasitic capacitance and to simplify layout routing.

In accordance with one aspect of at least one embodiment, a pattern for fabricating an array can be robust to first-order through fourth-order gradients. Fourth-order gradients can be observed across a wafer under at least some circumstances. The existence of such fourth-order gradients implies such effects may be observed over a narrow region. Therefore, improved matching performance can be obtained by generating a pattern capable of compensating for first-order through fourth-order gradients.

In accordance with at least one embodiment, appropriate matching is provided of four binary weighted capacitor groups associated with the first four bits of the converter plus calibration capacitor. In accordance with at least one embodiment, a pattern of subcomponents of capacitive structures is provided that minimizes ADC, INL, and DNL errors.

In accordance with at least one embodiment, a second order cancellation pattern with a dispersion of one is provided. In accordance with at least one embodiment, a third-order and fourth-order cancellation pattern is provided.

In accordance with at least one embodiment, a pattern of subcomponents of an array of capacitive structures has a dispersion of one. In accordance with at least one embodiment, a pattern supports increasing spacing to maximize inherent matching of devices. In accordance with at least one embodiment, a pattern supports two rows to minimize top plate parasitic capacitance. In accordance with at least one embodiment, a pattern is robust to fourth-order gradients, providing cancellation of fourth-order gradients. In accordance with at least one embodiment, fourth-order gradients are a lower percentage of the overall gradients applied for testing. In accordance with at least one embodiment, a pattern is provided which maximizes matching of binary capacitance group. In accordance with at least one embodiment, a pattern is provided which minimizes DNL and INL errors. In accordance with at least one embodiment, a method is provided for generating patterns of subcomponents of an array of capacitive structures that provide compensation for gradients in physical properties of integrated circuit materials (e.g., semiconductor material) that can manifest themselves in undesired variation in electrical properties within an integrated circuit that can result component value mismatches.

In accordance with at least one embodiment, a method is provided to produce a DAC having better component matching in a poor process comprising the following elements. Firstly, an improvement in capacitor matching coefficient is forced by increasing capacitor spacing to 100-120 nm. Accordingly, the capacitor matching coefficient has been found to improve to 0.4% in at least one process, and matching performance has been provided over distance. Secondly, capacitors within the MDAC are sized to exceed KT/C requirements. Thirdly, top plate parasitic capacitance is reduced by implementing capacitive subcomponents in two rows, with one above and the other below the top plate route. Fourthly, the unit caps are divided into fourths to allow cancelling of gradients and maximizing of dispersion. Fifthly, pattern combinations are constructed and tested based upon the metrics of dispersion and maximum allowance second-order error. Sixthly, the top-performing patterns are tested within a mathematical (e.g., MATLAB) model capable of randomizing gradients from first-order through fourth-order against any pattern for INL errors. One or more of the patterns scoring best under the mathematical model are used to implement capacitive subcomponents in an array of capacitive structures.

In the accompanying drawings and this description, the letters A, B, C, D, and E are used to represent capacitive structures and the subcomponents which they comprise according to the following legend:

A=most-significant-bit (MSB) capacitive structure=capacitor C14

B=second-most-significant-bit (MSB−1) capacitive structure=capacitor C13

C=third-most-significant-bit (MSB−2) capacitive structure=capacitor C12

D=fourth-most-significant-bit (MSB−3) capacitive structure=capacitor C11

E=calibration capacitor

In accordance with at least one embodiment, a pattern referred to as "pattern #2" cancels third-order gradients beyond just the MSB capacitive structure (e.g., in the MSB to MSB−2 capacitive structures). Pattern #2 comprises a first row of subcomponents laid out as follows:

ABCABAADAEBACAABACBAEAABABDABAAC and a second row of subcomponents adjacent to the first row and laid out as follows:

DAABACBABAACABEABAAEABCACAABADBA.

In accordance with at least one embodiment, a pattern referred to as "pattern #3" cancels third-order gradients in MSB capacitive structures. Pattern #3 comprises a first row of subcomponents laid out as follows:

ADACABABBABACADAEACABABAABABACAE and a second row of subcomponents adjacent to the first row and laid out as follows:

EACABABAABABACAEADACABABBABACADA.

In accordance with at least one embodiment, a pattern referred to as "pattern #4" has a dispersion equal to one. An example of its implementation provides a maximum second-order delta of 44 and a maximum integral nonlinearity (INL) error of 0.0857 counts at 12 bits. Pattern #4 cancels second-order gradients in MSB caps. Pattern #4 comprises a first row of subcomponents laid out as follows:

ACADABACABABAEABACADABACABABAEAB and a second row of subcomponents adjacent to the first row and laid out as follows:

BAEABABACABADACABAEABABACABADACA.

In accordance with at least one embodiment, a pattern referred to as "pattern #5" cancels second-order gradients. Pattern #5 comprises a first row of subcomponents laid out as follows:

ACADAABABACAEBABACADAABABACAEBAB and a second row of subcomponents laid out as follows:

BABEACABABAADACABABEACABABAADACA.

In accordance with at least one embodiment, a pattern referred to as "Pattern #6" has a dispersion of one. An example of its implementation provides a maximum second-order delta of 224 and a maximum integral nonlinearity (INL) error of 0.3827 counts at 12 bits. Pattern #6 comprises a first row of subcomponents laid out as follows:

ABABABAEABACACADABABABAEABACACAD and a second row of subcomponents adjacent to the first row and laid out as follows:

DACACABAEABABABADACACABAEABABABA.

In accordance with at least one embodiment, a pattern of capacitive subcomponents joined together into capacitive structures can be determined as described below. Firstly, while exhaustive searching of all possible layout patterns for the number of device sections needed is too computationally burdensome to be done, symmetry can be used to guarantee cancellation of process gradients by appropriately combining sub-patterns which have been reflected, rotated, or both. Knowing this, one-dimensional arrays of one quarter of the sections of each device A though E can be exhaustively generated, with the restriction that no more than three sections of any one device can be adjacent. This restriction significantly limits the number of patterns generated, making the task computationally feasible, and recognizes that having a large number of adjacent sections is undesirable as it decreases the dispersion of the pattern. Subsequently, each of these generated quarter arrays are combined with every other of the quarter arrays of the same sub-pattern, both directly and rotated by 180 degrees, to generate a one-dimensional array with half of the final number of device sections, and a 180-degree rotated copy of each half array is added above that half array to generate a final number of device sections, and a 180-degree rotated copy of each half array is added above that half array to generate a final array, with two rows, with the full number of elements. Because the top row is a 180-degree rotated version of the bottom row, the final array is assured, by symmetry, to cancel first-order (linear) process gradients. All of the patterns so generated are numerically scored for dispersion and second-order (quadratic) process gradient cancellation (the maxD2 value discussed above). The patterns that optimized both dispersion and second-order gradient cancellation are then selected. In the examples shown above, patterns #4 and #5 result.

The elusiveness, even to those of ordinary skill in the art, of suitable patterns is illustrated by a long history of attempted development by many others of suitable patterns with only limited success, over which the subject matter disclosed herein provides technological improvement. Further evidence can be seen in that, while some suitable patterns (e.g., patterns #4 and #5) can be obtained as described above, other patterns (e.g., patterns #2, #3, and #6) were not so obtained. However, now that the inventors have succeeded in their exceedingly arduous efforts of developing the particularly suitable patterns disclosed herein, one of ordinary skill in the art, upon reading this disclosure, is enabled to implement an analog-to-digital converter (ADC) integrated circuit (IC) exhibiting remarkable immunity to process gradients and thus substantially improved component matching, thereby significantly improving performance over existing technology. Accordingly, the subject matter disclosed herein satisfies a long-standing need that has not heretofore been met and yields surprising results as compared with existing technology.

It is advantageous to match A to BCDE in order to maximize INL and DNL performance, as the MSB code typically has the worst performance in both INL and DNL. However, such a simple approach is not optimal, as different orders of matching A to BCDE in a cross-couple fashion do not necessarily produce the same results. Accordingly, maximizing matching and dispersion of all of the sub groups to their target values in the midst of gradients is done to maximize performance. Consequently, to perform such a task on the smaller group of capacitors within the 4-4-4 MDAC, a better matching coefficient is obtained from the capacitors through increasing the spacing beyond was provided from pcells and through a pattern that maximizes dispersions. Improved matching can be obtained through optimizing spacing and pattern dispersion as described herein.

Differential Non-Linearity (DNL) is a measure of one type of departure from ideal linear performance in data conversion. The output of an ADC exhibiting ideal linear performance would be divided into 2n uniform steps each of uniform width. The differential Non-Linearity (DNL) measures the departure from such an ideal uniform step width and is quantified as counts. An ADC's architecture bears upon its DNL. DNL cannot be corrected using calibration.

Integral Non-Linearity (INL) is a measure of an accumulation of DNL errors. INL is the maximum deviation from the ideal slope of the ADC. It is measured from the center of the step and is quantified as counts. As INL is a measure of an accumulation of DNL errors and an ADC's architecture bears upon its DNL, an ADC's architecture also bears upon its INL. As INL is a measure of an accumulation of DNL errors and DNL cannot be corrected using calibration, INL also cannot be corrected using calibration.

In accordance with at least one embodiment, an array of capacitive structures for a segmented successive approximation register (SAR) analog-to-digital converter (ADC) is provided. The array comprises a first capacitive structure comprises a first plurality of capacitive structure subcomponents; a second capacitive structure comprising a second plurality of capacitive structure subcomponents; a third capacitive structure comprising a third plurality of capacitive structure subcomponents; a fourth capacitive structure comprising a fourth plurality of capacitive structure subcomponents; and a fifth capacitive structure comprising a fifth plurality of capacitive structure subcomponents, wherein a first respective terminal of each capacitive structure subcomponent of the first, second, third, fourth, and fifth pluralities of capacitive structure subcomponents is connected to a common conductor, and wherein a second respective terminal of each capacitive structure subcomponent of the first plurality of capacitive structure subcomponents is connected together among each other, wherein a second respective terminal of each capacitive structure subcomponent of the second plurality of capacitive structure subcomponents is connected together among each other, wherein a second respective terminal of each capacitive structure subcomponent of the third plurality of capacitive structure subcomponents is connected together among each other, wherein a second respective terminal of each capacitive structure subcomponent of the fourth plurality of capacitive structure subcomponents is connected together among each other, and wherein a second respective terminal of each capacitive structure subcomponent of the fourth plurality of capacitive structure subcomponents is connected together among each other, wherein the first plurality of capacitive structure subcomponents are denoted by the letter A, the second plurality of capacitive structure subcomponents are denoted by the letter B, the third plurality of capacitive structure subcomponents are denoted by the letter C, the fourth plurality of capacitive structure subcomponents are denoted by the letter D, and the fifth plurality of capacitive structure subcomponents are denoted by the letter E in a topological layout on a semiconductor die selected from a group consisting of:

a first pattern as follows: ABCABAADAEBACAABACBAEAABABDABAAC, DAABACBABAACABEABAAEABCACAABADBA;

a second pattern as follows: ADACABABBABACADAEACABABAABABACAE, EACABABAABABACAEADACABABBABACADA;

a third pattern as follows: ACADABACABABAEABACADABACABABAEAB, BAEABABACABADACABAEABABACABADACA;

a fourth pattern as follows: ACADAABABACAEBABACADAABABACAEBAB, BABEACABABAADACABABEACABABAADACA; and a fifth pattern as follows: ABABABAEABACACADABABABAEABACACAD, DACACABAEABABABADACACABAEABABABA.

In accordance with at least one embodiment, the first capacitive structure has a first nominal capacitance of twice a second nominal capacitance of the second capacitive structure, wherein the second nominal capacitance is twice a third nominal capacitance of the third capacitive structure, and wherein the third nominal capacitance is twice a fourth nominal capacitance of the fourth capacitive structure. In accordance with at least one embodiment, a fifth nominal capacitance of the fifth capacitive structure is equal to the fourth nominal capacitance. In accordance with at least one embodiment, the fifth capacitive structure is a calibration capacitive structure, the calibration capacitive structure configured to provide a basis for calibration of an analog-to-digital converter (ADC) comprising the array. In accordance with at least one embodiment, the first capacitive structure corresponds to a most significant bit (MSB) value, the second capacitive structure corresponds to a second-to-most significant bit (MSB−1) value, the third capacitive structure corresponds to a third-to-most significant bit (MSB−2) value, and the fourth capacitive structure corresponds to a fourth-to-most (MSB−3) value. In accordance with at least one embodiment, the fifth capacitive structure is a calibration capacitive structure, the calibration capacitive structure configured to provide a basis for calibration of the SAR ADC. In accordance with at least one embodiment, the common conductor is situated between a first row of the topological layout and a second row of the topological layout.

In accordance with at least one embodiment, a method for improving component matching for a segmented successive approximation register (SAR) analog-to-digital converter (ADC) is provided. The method comprises fabricating in a semiconductor device a first capacitive structure comprising a first plurality of capacitive structure subcomponents; fabricating in the semiconductor device a second capacitive structure comprising a second plurality of capacitive structure subcomponents; fabricating in the semiconductor device a third capacitive structure comprising a third plurality of capacitive structure subcomponents; fabricating in the semiconductor device a fourth capacitive structure comprising a fourth plurality of capacitive structure subcomponents; and fabricating in the semiconductor device a fifth capacitive structure comprising a fifth plurality of capacitive structure subcomponents, wherein a first respective terminal of each capacitive structure subcomponent of the first, second, third, fourth, and fifth pluralities of capacitive structure subcomponents is connected to a common conductor, and wherein a second respective terminal of each capacitive structure subcomponent of the first plurality of capacitive structure subcomponents is connected together among each other, wherein a second respective terminal of each capacitive structure subcomponent of the second plurality of capacitive structure subcomponents is connected together among each other, wherein a second respective terminal of each capacitive structure subcomponent of the third plurality of capacitive structure subcomponents is connected together among each other, wherein a second respective terminal of each capacitive structure subcomponent of the fourth plurality of capacitive structure subcomponents is connected together among each other, and wherein a second respective terminal of each capacitive structure subcomponent of the fourth plurality of capacitive structure subcomponents is connected together among each other, wherein the first plurality of capacitive structure subcomponents are denoted by the letter A, the second plurality of capacitive structure subcomponents are denoted by the letter B, the third plurality of capacitive structure subcomponents are denoted by the letter C, the fourth plurality of capacitive structure subcomponents are denoted by the letter D, and the fifth plurality of capacitive structure subcomponents are denoted by the letter E in a topological layout on a semiconductor die selected from a group consisting of:

a first pattern as follows: ABCBAADAEBA-CAABACBAEAABABDABAAC, DAABACBABAACA-BEABAAEABCACAABADBA;

a second pattern as follows: ADACABABBABACA-DAEACABABAABABACAE, EACABABAABABA-CAEADACABABBABACADA;

a third pattern as follows: ACADABACABABAEABA-CADABACABABAEAB, BAEABABACABADACA-BAEABABACABADACA;

a fourth pattern as follows: ACADAABABACAEBABA-CADAABABACAEBAB, BABEACABABAADACABA-BEACABABAADACA; and a fifth pattern as follows: ABABABAEABACACADA-BABABAEABACACAD, DACACABAEABABABADA-CACABAEABABABA.

In accordance with at least one embodiment, the first capacitive structure has a first nominal capacitance of twice a second nominal capacitance of the second capacitive structure, wherein the second nominal capacitance is twice a third nominal capacitance of the third capacitive structure, and wherein the third nominal capacitance is twice a fourth nominal capacitance of the fourth capacitive structure. In accordance with at least one embodiment, a fifth nominal capacitance of the fifth capacitive structure is equal to the fourth nominal capacitance. In accordance with at least one embodiment, the fifth capacitive structure is a calibration capacitive structure, the calibration capacitive structure configured to provide a basis for calibration of an analog-to-digital converter (ADC) comprising the array. In accordance with at least one embodiment, the first capacitive structure corresponds to a most significant bit (MSB) value, the second capacitive structure corresponds to a second-to-most significant bit (MSB−1) value, the third capacitive structure corresponds to a third-to-most significant bit (MSB−2) value, and the fourth capacitive structure corresponds to a fourth-to-most (MSB−3) value. In accordance with at least one embodiment, the fifth capacitive structure is a calibration capacitive structure, the calibration capacitive structure configured to provide a basis for calibration of the SAR ADC. In accordance with at least one embodiment, the common conductor is situated between a first row of the topological layout and a second row of the topological layout.

In accordance with at least one embodiment, a segmented successive approximation register (SAR) for an analog-to-digital converter (ADC) is provided. The segmented SAR comprises a first capacitive structure comprising a first plurality of capacitive structure subcomponents; a second capacitive structure comprising a second plurality of capacitive structure subcomponents; a third capacitive structure comprising a third plurality of capacitive structure subcomponents; a fourth capacitive structure comprising a fourth plurality of capacitive structure subcomponents; and a fifth capacitive structure comprising a fifth plurality of capacitive structure subcomponents, wherein a first respective terminal of each capacitive structure subcomponent of the first, second, third, fourth, and fifth pluralities of capacitive structure subcomponents is connected to a common conductor, and wherein a second respective terminal of each capacitive structure subcomponent of the first plurality of capacitive structure subcomponents is connected together among each other, wherein a second respective terminal of each capacitive structure subcomponent of the second plurality of capacitive structure subcomponents is connected together among each other, wherein a second respective terminal of each capacitive structure subcomponent of the third plurality of capacitive structure subcomponents is connected together among each other, wherein a second respective terminal of each capacitive structure subcomponent of the fourth plurality of capacitive structure subcomponents is connected together among each other, and wherein a second respective terminal of each capacitive structure subcomponent of the fourth plurality of capacitive structure subcomponents is connected together among each other, wherein the first plurality of capacitive structure subcomponents are denoted by the letter A, the second plurality of capacitive structure subcomponents are denoted by the letter B, the third plurality of capacitive structure subcomponents are denoted by the letter C, the fourth plurality of capacitive structure subcomponents are denoted by the letter D, and the fifth plurality of capacitive structure subcomponents are denoted by the letter E in a topological layout on a semiconductor die selected from a group consisting of:
  a first pattern as follows: ABCABAADAEBA-CAABACBAEAABABDABAAC, DAABACBABAACA-BEABAAEABCACAABADBA;
  a second pattern as follows: ADACABABBABACA-DAEACABABAABABACAE, EACABABAABABA-CAEADACABABBABACADA;
  a third pattern as follows: ACADABACABABAEABA-CADABACABABAEAB, BAEABABACABADACA-BAEABABACABADACA;
  a fourth pattern as follows: ACADAABABACAEBABA-CADAABABACAEBAB, BABEACABABAADACABA-BEACABABAADACA; and
  a fifth pattern as follows: ABABABAEABACACADA-BABABAEABACACAD, DACACABAEABABABADA-CACABAEABABABA.

In accordance with at least one embodiment, the first capacitive structure has a first nominal capacitance of twice a second nominal capacitance of the second capacitive structure, wherein the second nominal capacitance is twice a third nominal capacitance of the third capacitive structure, and wherein the third nominal capacitance is twice a fourth nominal capacitance of the fourth capacitive structure. In accordance with at least one embodiment, a fifth nominal capacitance of the fifth capacitive structure is equal to the fourth nominal capacitance. In accordance with at least one embodiment, the fifth capacitive structure is a calibration capacitive structure, the calibration capacitive structure configured to provide a basis for calibration of an analog-to-digital converter (ADC) comprising the array. In accordance with at least one embodiment, the first capacitive structure corresponds to a most significant bit (MSB) value, the second capacitive structure corresponds to a second-to-most significant bit (MSB−1) value, the third capacitive structure corresponds to a third-to-most significant bit (MSB−2) value, and the fourth capacitive structure corresponds to a fourth-to-most (MSB−3) value. In accordance with at least one embodiment, the fifth capacitive structure is a calibration capacitive structure, the calibration capacitive structure configured to provide a basis for calibration of the SAR ADC.

In accordance with at least one embodiment, an array of capacitive structures for a segmented successive approximation register (SAR) analog-to-digital converter (ADC), the array comprises a first capacitive structure comprising a first plurality of capacitive structure subcomponents. A first respective terminal of each capacitive structure subcomponent of the first plurality of capacitive structure subcomponents is connected to a common conductor. A second respective terminal of each capacitive structure subcomponent of the first plurality of capacitive structure subcomponents is connected together among each other. The first plurality of capacitive structure subcomponents are denoted by the letter A. The letter x denotes other capacitive structure subcomponents in a topological layout on a semiconductor die selected from a one-capacitor group consisting of:
  a first pattern as follows:
    AxxAxAAxAxxAxAAxAxxAxAAxAxxAxAAx,
    xAAxAxAxAAxAxAxAAxAxAxAAxAxA;
  a second pattern as follows:
    AxAxAxAxAxAxAxAxAxAxAAxAxAxAx,
    xAxAxAxAxAxAxAxAxAxAxAxAxAxA;
  a third pattern as follows:
    AxAxAxAxAxAxAxAxAxAxAxAxAxAxAx,
    xAxAxAxAxAxAxAxAxAxAxAxAxAxAxA; and
  a fourth pattern as follows:
    AxAxAAxAxAxAxAxAxAxAAxAxAxAxAx,
    xAxAxAxAxAAxAxAxAxAxAxAxAAxAxA.

In accordance with at least one embodiment, the further comprises a second capacitive structure comprising a second plurality of capacitive structure subcomponents. The second plurality of capacitive structure subcomponents are denoted by the letter B in the topological layout on a semiconductor die selected from a two-capacitor group consisting of:
  the first pattern more specifically as follows:
    ABxABAAxAxBAxAABAxBAxAABABxABAAx,
    xAABAxBABAAxABxABAAxABxAxAABAxBA;
  the second pattern more specifically as follows:
    AxAxABABBABAxAxAxAxABABAABABAxAx,
    xAxABABAABABAxAxAxAxABABBABAxAxA;
  the third pattern more specifically as follows:
    AxAxABAxABABAxABAxAxABAxABABAxAB,
    BAxABABAxABAxAxABAxABABAxABAxAxA;
  the fourth pattern more specifically as follows:
    AxAxAABABAxAxBABAxAxAABABAxAxBAB,
    BABxAxABABAAxAxABABxAxABABAAxAxA; and
  and a fifth pattern as follows:
    ABABABAxABABAxAxAxABABABAxABAxAxAx,
    xAxAxABAxABABABAxAxAxABAxABABABA.

In accordance with at least one embodiment, the array further comprises a third capacitive structure comprising a third plurality of capacitive structure subcomponents. The third plurality of capacitive structure subcomponents are denoted by the letter C in the topological layout on a semiconductor die selected from a three-capacitor group consisting of:
  the first pattern more specifically as follows:
    ABCABAAxAxBACAABACBAxAABABxABAAC,
    xAABACBABAACABxABAAxABCACAABAxBA;
  the second pattern more specifically as follows:
    AxACABABBABACAxAxACABABAABABACAx,
    xACABABAABABACAxAxACABABBABACAxA;
  the third pattern more specifically as follows:
    ACAxABACABABAxABACAxABACABABAxAB,
    BAxABABACABAxACABAxABABACABAxACA;
  the fourth pattern more specifically as follows:
    ACAxAABABACAxBABACAxAABABACAxBAB,
    BABxACABABAAxACABABxACABABAAxACA;
  and
  the fifth pattern more specifically as follows:
    ABABABAxABACACAxABABABAxABACACAx,
    xACACABAxABABABAxACACABAxABABABA.

In accordance with at least one embodiment, the array further comprises a fourth capacitive structure comprising a fourth plurality of capacitive structure subcomponents. The fourth plurality of capacitive structure subcomponents are denoted by the letter D, in the topological layout on a semiconductor die selected from a four-capacitor group consisting of:
  the first pattern more specifically as follows:
    ABCABAADAxBACAABACBAxAABABDABAAC,
    DAABACBABAACABxABAAxABCACAABADBA;
  the second pattern more specifically as follows:
    ADACABABBABACADAxACABABAABABACAx,
    xACABABAABABACAxADACABABBABACADA;
  the third pattern more specifically as follows:
    ACADABACABABAxABACADABACABABAxAB,
    BAxABABACABADACABAxABABACABADACA;
  the fourth pattern more specifically as follows:
    ACADAABABACAxBABACADAABABACAxBAB,
    BABxACABABAADACABABxACABABAADACA;
  and the fifth pattern more specifically as follows:
ABABABAxABACACADABABABAxABACACAD,
DACACABAxABABABADACACABAxABABABA.

In accordance with at least one embodiment, the array further comprises a fifth capacitive structure comprising a fifth plurality of capacitive structure subcomponents. The fifth plurality of capacitive structure subcomponents are denoted by the letter E in the topological layout on a semiconductor die selected from a five-capacitor group consisting of:
the first pattern more specifically as follows:
ABCABAADAEBACAABACBAEAABABDABAAC,
DAABACBABAACABEABAAEABCACAABADBA;
the second pattern more specifically as follows:
ADACABABBABACADAEACABABAABABACAE,
EACABABAABABACAEADACABABBABACADA;
the third pattern more specifically as follows:
ACADABACABABAEABACADABACABABAEAB,
BAEABABACABADACABAEABABACABADACA;
the fourth pattern more specifically as follows:
ACADAABABACAEBABACADAABABACAEBAB,
BABEACABABAADACABABEACABABAADACA;
and
the fifth pattern more specifically as follows:
ABABABAEABACACADABABABAEABACACAD,
DACACABAEABABABADACACABAEABABABA.

In accordance with at least one embodiment, the first capacitive structure has a first nominal capacitance of twice a second nominal capacitance of the second capacitive structure, wherein the second nominal capacitance is twice a third nominal capacitance of the third capacitive structure, and wherein the third nominal capacitance is twice a fourth nominal capacitance of the fourth capacitive structure. In accordance with at least one embodiment, a fifth nominal capacitance of the fifth capacitive structure is equal to the fourth nominal capacitance. In accordance with at least one embodiment, the fifth capacitive structure is a calibration capacitive structure, the calibration capacitive structure configured to provide a basis for calibration of an analog-to-digital converter (ADC) comprising the array. In accordance with at least one embodiment, the first capacitive structure corresponds to a most significant bit (MSB) value, the second capacitive structure corresponds to a second-to-most significant bit (MSB−1) value, the third capacitive structure corresponds to a third-to-most significant bit (MSB−2) value, and the fourth capacitive structure corresponds to a fourth-to-most (MSB−3) value. In accordance with at least one embodiment, the fifth capacitive structure is a calibration capacitive structure, the calibration capacitive structure configured to provide a basis for calibration of the SAR ADC. In accordance with at least one embodiment, the common conductor is situated between a first row of the topological layout and a second row of the topological layout.

In accordance with at least one embodiment, a method for improving component matching for a segmented successive approximation register (SAR) analog-to-digital converter (ADC), the method comprises fabricating in a semiconductor device a first capacitive structure comprising a first plurality of capacitive structure subcomponents. A first respective terminal of each capacitive structure subcomponent of the first plurality of capacitive structure subcomponents is connected to a common conductor. A second respective terminal of each capacitive structure subcomponent of the first plurality of capacitive structure subcomponents is connected together among each other. The first plurality of capacitive structure subcomponents are denoted by the letter A. The letter x denotes other capacitive structure subcomponents in a topological layout on a semiconductor die selected from a group consisting of:
a first pattern as follows:
AxxAxAAxAxxAxAAxAxxAxAAxAxxAxAAx,
xAAxAxxAxAAxAxxAxAAxAxxAxAAxAxxA;
a second pattern as follows:
AxAxAxAxxAxAxAxAxAxAxAAxAxAxAx,
xAxAxAxAAxAxAxAxAxAxAxxAxAxAxA;
a third pattern as follows:
AxAxAxAxAxAxAxAxAxAxAxAxAxAxAx,
xAxAxAxAxAxAxAxAxAxAxAxAxAxAxA; and
a fourth pattern as follows:
AxAxAAxAxAxAxxAxAxAxAAxAxAxAxxAx,
xAxxAxAxAxAAxAxAxAxxAxAxAxAAxAxA.

In accordance with at least one embodiment, the method further comprises fabricating in the semiconductor device a second capacitive structure comprising a second plurality of capacitive structure subcomponents. The second plurality of capacitive structure subcomponents are denoted by the letter B in the topological layout on a semiconductor die selected from a two-capacitor group consisting of:
the first pattern more specifically as follows:
ABxABAAxAxBAxAABAxBAxAABABxABAAx,
xAABAxBABAAxABxABAAxABxAxAABAxBA;
the second pattern more specifically as follows:
AxAxABABBABAxAxAxAxABABAABABAxAx,
xAxABABAABABAxAxAxAxABABBABAxAxA;
the third pattern more specifically as follows:
AxAxABAxABABAxABAxAxABAxABABAxAB,
BAxABABAxABAxAxABABABAxABAxAxA;
the fourth pattern more specifically as follows:
AxAxAABABAxAxBABAxAxAABABAxAxBAB,
BABxAxABABAAxAxABABxAxABABAAxAxA; and
a fifth pattern as follows:
ABABABAxABAxAxAxABABABAxABAxAxAx,
xAxAxABAxABABABAxAxAxABAxABABABA.

In accordance with at least one embodiment, the method further comprises fabricating in the semiconductor device a third capacitive structure comprising a third plurality of capacitive structure subcomponents. The third plurality of capacitive structure subcomponents are denoted by the letter C in the topological layout on a semiconductor die selected from a three-capacitor group consisting of:
the first pattern more specifically as follows:
ABCABAAxAxBACAABACBAxAABABxABAAC,
xAABACBABAACABxABAAxABCACAABAxBA;
the second pattern more specifically as follows:
AxACABABBABACAxAxACABABAABABACAx,
xACABABAABABACAxAxACABABBABACAxA;
the third pattern more specifically as follows:
ACAxABACABABAxABACAxABACABABAxAB,
BAxABABACABAxACABxABABACABAxACA;
the fourth pattern more specifically as follows:
ACAxAABABACAxBABACAxAABABACAxBAB,
BABxACABABAAxACABABxACABABAAxACA;
and
the fifth pattern more specifically as follows:
ABABABAxABACACAxABABABAxABACACAx,
xACACABAxABABABAxACACABAxABABABA.

In accordance with at least one embodiment, the method further comprises fabricating in the semiconductor device a fourth capacitive structure comprising a fourth plurality of capacitive structure subcomponents. The fourth plurality of capacitive structure subcomponents are denoted by the letter D, in the topological layout on a semiconductor die selected from a four-capacitor group consisting of:

the first pattern more specifically as follows:
ABCABAADAxBACAABACBAxAABABDABAAC,
DAABACBABAACABxABAAxABCACAABADBA;
the second pattern more specifically as follows:
ADACABABBABACADAxACABABAABABACAx,
xACABABAABABACAxADACABABBABACADA;
the third pattern more specifically as follows:
ACADABACABABAxABACADABACABABAxAB,
BAxABABACABADACABAxABABACABADACA;
the fourth pattern more specifically as follows:
ACADAABABACAxBABACADAABABACAxBAB,
BABxACABABAADACABABxACABABAADACA;
and
the fifth pattern more specifically as follows:
ABABABAxABACACADABABABAxABACACAD,
DACACABAxABABABADACACABAxABABABA.

In accordance with at least one embodiment, the method further comprises fabricating in the semiconductor device a fifth capacitive structure comprising a fifth plurality of capacitive structure subcomponents. The fifth plurality of capacitive structure subcomponents are denoted by the letter E in the topological layout on a semiconductor die selected from a five-capacitor group consisting of:
the first pattern more specifically as follows:
ABCABAADAEBACAABACBAEAABABDABAAC,
DAABACBABAACABEABAAEABCACAABADBA;
the second pattern more specifically as follows:
ADACABABBABACADAEACABABAABABACAE,
EACABABAABABACAEADACABABBABACADA;
the third pattern more specifically as follows:
ACADABACABABAEABACADABACABABAEAB,
BAEABABACABADACABAEABABACABADACA;
the fourth pattern more specifically as follows:
ACADAABABACAEBABACADAABABACAEBAB,
BABEACABABAADACABABEACABABAADACA;
and
the fifth pattern more specifically as follows:
ABABABAEABACACADABABABAEABACACAD,
DACACABAEABABABADACACABAEABABABA.

In accordance with at least one embodiment, the first capacitive structure has a first nominal capacitance of twice a second nominal capacitance of the second capacitive structure, wherein the second nominal capacitance is twice a third nominal capacitance of the third capacitive structure, and wherein the third nominal capacitance is twice a fourth nominal capacitance of the fourth capacitive structure. In accordance with at least one embodiment, a fifth nominal capacitance of the fifth capacitive structure is equal to the fourth nominal capacitance. In accordance with at least one embodiment, the fifth capacitive structure is a calibration capacitive structure, the calibration capacitive structure configured to provide a basis for calibration of an analog-to-digital converter (ADC) comprising the array. In accordance with at least one embodiment, the first capacitive structure corresponds to a most significant bit (MSB) value, the second capacitive structure corresponds to a second-to-most significant bit (MSB−1) value, the third capacitive structure corresponds to a third-to-most significant bit (MSB−2) value, and the fourth capacitive structure corresponds to a fourth-to-most (MSB−3) value. In accordance with at least one embodiment, the fifth capacitive structure is a calibration capacitive structure, the calibration capacitive structure configured to provide a basis for calibration of the SAR ADC.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures.

In this document, relational terms such as "first" and "second," and the like, may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The terms "substantially," "about," and their variants, as used herein are intended to refer to the qualified article being sufficient to achieve the stated purpose or value in a practical manner, which includes taking into account any minor imperfections or deviations, if any, that arise from usual and expected abnormalities that may occur during device operation, which are not significant for the stated purpose or value. In addition, the term "substantially" has further been defined herein in the context of specific attributes to identify specific ranges.

What is claimed is:
1. An integrated circuit comprising:
   a segmented successive approximation register (SAR) analog-to-digital converter (ADC) including:

a first capacitive structure comprising a first plurality of capacitive structure subcomponents with first terminals connected to respective selective switches and second terminals connected to a common conductor;
a second capacitive structure comprising a second plurality of capacitive structure subcomponents with first terminals connected to selective switches, and second terminals connected to the common conductor;
wherein:
a nominal capacitive value of each of the first plurality of capacitive structure subcomponents is a multiple of a nominal capacitive value of each of the second plurality of capacitive structure subcomponents, and
the first and second plurality of capacitive structure subcomponents are arranged in an array in which no more than two of the first plurality of capacitive structure subcomponents are directly adjacent to one another in a first direction in the array.

2. The integrated circuit of claim 1 wherein:
none of the first plurality of capacitive structure subcomponents are directly adjacent to one another in a second direction in the array, the second direction is orthogonal to the first direction.

3. The integrated circuit of claim 1 wherein:
no more than one of the first plurality of capacitive structure subcomponents is directly adjacent to another of the first plurality of capacitive structure subcomponents in a second direction in the array, the second direction is orthogonal to the first direction.

4. The integrated circuit of claim 1 wherein:
none of the second plurality of capacitive structure subcomponents are directly adjacent to one another in the first direction in the array.

5. The integrated circuit of claim 4 wherein:
none of the second plurality of capacitive structure subcomponents are directly adjacent to one another in a second direction in the array, the second direction is orthogonal to the first direction.

6. The integrated circuit of claim 2 further comprising:
a third capacitive structure comprising a third plurality of capacitive structure subcomponents in the array, wherein
the third plurality of capacitive structure subcomponents include first terminals connected to respective selective switches and second terminals connected to the common conductor;
a nominal capacitive value of each of the first plurality of capacitive structure subcomponents is a second multiple of a nominal capacitive value of each of the third plurality of capacitive structure subcomponents, and
none of the third plurality of capacitive structure subcomponents in the array are directly adjacent to one another in the first direction.

7. The integrated circuit of claim 6 wherein:
none of the third plurality of capacitive structure subcomponents in the array are directly adjacent to one another in the second direction in the array.

8. The integrated circuit of claim 6 further comprising:
a fourth capacitive structure comprising a fourth plurality of capacitive structure subcomponents in the array, wherein
the fourth plurality of capacitive structure subcomponents include first terminals connected to respective selective switches and second terminals connected to the common conductor;
a nominal capacitive value of each of the first plurality of capacitive structure subcomponents is a third multiple of a nominal capacitive value of each of the fourth plurality of capacitive structure subcomponents, and
none of the fourth plurality of capacitive structure subcomponents in the array are directly adjacent to one another in the first direction.

9. The integrated circuit of claim 8 wherein:
none of the fourth plurality of capacitive structure subcomponents in the array are directly adjacent to one another in the second direction in the array.

10. The integrated circuit of claim 8 wherein the first capacitive structure has a first nominal capacitance value of twice a second nominal capacitance value of the second capacitive structure, wherein the second nominal capacitance value is twice a third nominal capacitance value of the third capacitive structure, and wherein the third nominal capacitance value is twice a fourth nominal capacitance of the fourth capacitive structure.

11. The integrated circuit of claim 1 further comprising a calibration capacitive structure, the calibration capacitive structure configured to provide a basis for calibration of the SAR ADC.

12. The integrated circuit of claim 8 wherein the first capacitive structure corresponds to a most significant bit (MSB) value, the second capacitive structure corresponds to a second-to-most significant bit (MSB−1) value, the third capacitive structure corresponds to a third-to-most significant bit (MSB−2) value, and the fourth capacitive structure corresponds to a fourth-to-most (MSB−3) value.

13. The integrated circuit of claim 1 wherein a common conductor connected to the first and second capacitive structures is situated between a first row of a topological layout of the integrated circuit and a second row of the topological layout.

14. A method for fabricating an integrated circuit including a segmented successive approximation register (SAR) analog-to-digital converter (ADC), the method comprising:
forming a first capacitive structure as part of the SAR ADC comprising a first plurality of capacitive structure subcomponents that each include a first terminal selectively connected to one of a plurality of input voltage nodes and a second terminal connected to a common conductor;
forming a second capacitive structure as part of the SAR ADC comprising a second plurality of capacitive structure subcomponents that each include a first terminal selectively connected to one of the plurality of input voltage nodes and a second terminal connected to the common conductor,
wherein:
the first and second plurality of capacitive structure subcomponents are arranged in an array in which none of the first plurality of capacitive structure subcomponents are directly adjacent to one another and none of the second plurality of capacitive structure subcomponents are directly adjacent to one another in a first direction in the array.

15. The method of claim 14 wherein:
no more than one of the first plurality of capacitive structure subcomponents is directly adjacent to another of the first plurality of capacitive structure subcomponents in a second direction in the array, the second direction is orthogonal to the first direction.

16. The method of claim 14 wherein:

none of the second plurality of capacitive structure subcomponents are directly adjacent to one another in a second direction in the array, the second direction is orthogonal to the first direction.

17. The method of claim 14 further comprising:

a third capacitive structure comprising a third plurality of capacitive structure subcomponents in the array selectively connected in parallel to one another and to the first and second plurality of capacitive structure subcomponents, wherein
   none of the third plurality of capacitive structure subcomponents in the array are directly adjacent to one another in the first direction, and
   none of the third plurality of capacitive structure subcomponents in the array are directly adjacent to one another in the second direction in the array.

18. The method of claim 17 wherein:

a sequence of the first plurality of capacitive structure subcomponents in a first portion of a first row of the array is repeated in different portion of a directly adjacent row of the array.

19. The method of claim 18 further comprising:

a fourth capacitive structure comprising a fourth plurality of capacitive structure subcomponents in the array selectively connected in parallel to one another and to the first, second and third plurality of capacitive structure subcomponents, wherein
   a nominal capacitive value of each of the first plurality of capacitive structure subcomponents is a third multiple of a nominal capacitive value of each of the fourth plurality of capacitive structure subcomponents, and
   none of the fourth plurality of capacitive structure subcomponents in the array are directly adjacent to one another in the first direction.

20. An integrated circuit including a segmented successive approximation register (SAR) analog-to-digital converter (ADC), comprising:

a first capacitive structure as part of the SAR ADC including a first plurality of capacitive structure subcomponents that each include a first terminal selectively connected to one of a plurality of input voltage nodes and a second terminal connected to a common conductor;

a second capacitive structure as part of the SAR ADC including a second plurality of capacitive structure subcomponents that each include a first terminal selectively connected to one of the plurality of input voltage nodes and a second terminal connected to the common conductor, wherein:

the first and second plurality of capacitive structure subcomponents are arranged in an array in which none of the first plurality of capacitive structure subcomponents are directly adjacent to one another and none of the second plurality of capacitive structure subcomponents are directly adjacent to one another in a first row in the array.

* * * * *